United States Patent
Fujii et al.

(10) Patent No.: US 9,276,043 B2
(45) Date of Patent: Mar. 1, 2016

(54) PHOTOELECTRIC CONVERSION DEVICE, METHOD OF MANUFACTURING PHOTOELECTRIC CONVERSION DEVICE, SOLID-STATE IMAGING UNIT, AND ELECTRONIC APPARATUS

(71) Applicant: SONY CORPORATION, Tokyo (JP)

(72) Inventors: Nobutoshi Fujii, Kanagawa (JP); Hayato Iwamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/372,702

(22) PCT Filed: Jan. 18, 2013

(86) PCT No.: PCT/JP2013/050893
§ 371 (c)(1),
(2) Date: Jul. 16, 2014

(87) PCT Pub. No.: WO2013/111676
PCT Pub. Date: Aug. 1, 2013

(65) Prior Publication Data
US 2014/0367668 A1 Dec. 18, 2014

(30) Foreign Application Priority Data
Jan. 25, 2012 (JP) ................ 2012-012654

(51) Int. Cl.
*H01L 31/0232* (2014.01)
*H01L 31/113* (2006.01)
*C25D 5/02* (2006.01)
*H01L 27/30* (2006.01)
*H01L 27/146* (2006.01)
*G02B 3/00* (2006.01)

(52) U.S. Cl.
CPC .......... *H01L 27/307* (2013.01); *H01L 27/1464* (2013.01); *H01L 27/14627* (2013.01); *H01L 27/14636* (2013.01); *H01L 27/14647* (2013.01); *H01L 27/14685* (2013.01); *G02B 3/0012* (2013.01)

(58) Field of Classification Search
CPC ............. B29C 41/20; B29D 11/00278; H01L 27/14603; H01L 27/14621; H01L 27/14627; H01L 27/14632
See application file for complete search history.

(56) References Cited

U.S. PATENT DOCUMENTS

| 5,536,455 | A  | * | 7/1996 | Aoyama et al. | ............... 264/1.7 |
| 2011/0024858 | A1 | * | 2/2011 | Yoshihara et al. | ............ 257/432 |
| 2011/0156104 | A1 | * | 6/2011 | Yamaguchi | .................. 257/222 |

FOREIGN PATENT DOCUMENTS

| JP | 2006-278446 |   | 10/2006 |
| JP | 2007-012796 |   | 1/2007 |
| JP | 2008-168118 |   | 7/2008 |
| JP | 2008-258474 |   | 10/2008 |
| JP | 2011-029337 |   | 2/2011 |
| JP | 2011-071862 | A | 4/2011 |
| JP | 2011-138927 |   | 7/2011 |
| JP | 2011-138927 | A | 7/2011 |
| JP | 2011-199294 |   | 10/2011 |

* cited by examiner

*Primary Examiner* — Pamela E Perkins
(74) *Attorney, Agent, or Firm* — Sheridan Ross P.C.

(57) ABSTRACT

A method of manufacturing a photoelectric conversion device includes: forming a first electrode on a first surface side of a substrate that has two opposing surfaces; forming an electrode section on a second surface side of the substrate, the electrode section being used for external connection; and after forming the first electrode and the electrode section, forming an organic photoelectric conversion layer and a second electrode on the first electrode.

11 Claims, 25 Drawing Sheets

PHOTOELECTRIC CONVERSION DEVICE, METHOD OF MANUFACTURING PHOTOELECTRIC CONVERSION DEVICE, SOLID-STATE IMAGING UNIT, AND ELECTRONIC APPARATUS

CROSS REFERENCE TO RELATED APPLICATIONS

This application is a national stage application under 35 U.S.C. 371 and claims the benefit of PCT Application No. PCT/JP2013/050893 having an international filing date of Jan. 18, 2013, which designated the United States, which PCT application claimed the benefit of Japanese Patent Application No. 2012-012654 filed Jan. 25, 2012, the disclosure of each of which is incorporated herein by reference.

TECHNICAL FIELD

The present disclosure relates to a photoelectric conversion device that uses an organic photoelectric conversion film, to a method of manufacturing the photoelectric conversion device, to a solid-state imaging unit, and to an electronic apparatus.

BACKGROUND ART

Many methods of manufacturing a solid-state imaging unit with the use of an organic photoelectric conversion material have been proposed (for example, Patent Literatures 1 to 4). In Patent Literatures 1 and 2, a solid-state imaging unit that does not require any color filter (a solid-state imaging unit without a color filter) is achieved by using a plurality of types of organic photoelectric conversion films. Further, Patent Literatures 3 and 4 propose a technique to use both organic and inorganic photoelectric conversion films.

CITATION LIST

Patent Literature

Patent Literature 1: Japanese Unexamined Patent Application Publication No. 2007-12796
Patent Literature 2: Japanese Unexamined Patent Application Publication No. 2011-29337
Patent Literature 3: Japanese Unexamined Patent Application Publication No. 2008-258474
Patent Literature 4: Japanese Unexamined Patent Application Publication No. 2006-278446

SUMMARY OF THE INVENTION

In a solid-state imaging unit that uses the organic photoelectric conversion material as that described above, degradation in the organic photoelectric conversion layer is a concern in a case where a temperature equal to or higher than a tolerable temperature of the organic photoelectric conversion layer is applied to the organic photoelectric conversion layer after the organic photoelectric conversion layer is formed. Therefore, it is desired to achieve a photoelectric conversion device capable of suppressing degradation in the organic photoelectric conversion layer and to achieve a method of manufacturing such a photoelectric conversion device.

Accordingly, it is desirable to provide a method of manufacturing a photoelectric conversion device, a photoelectric conversion device, a solid-state imaging unit, and an electronic apparatus that are capable of suppressing degradation in the organic photoelectric conversion layer.

A method of manufacturing a photoelectric conversion layer according to an embodiment of the present disclosure includes: forming a first electrode on a first surface side of a substrate that has two opposing surfaces; forming an electrode section on a second surface side of the substrate, the electrode section being used for external connection; and after forming the first electrode and the electrode section, forming an organic photoelectric conversion layer and a second electrode on the first electrode.

In the method of manufacturing the photoelectric conversion device according to the embodiment of the present disclosure, the organic photoelectric conversion layer and the second electrode are formed on the first electrode after the first electrode is formed on the first surface side of the substrate and the electrode section used for the external connection is formed on the second surface side of the substrate. By forming the electrode section before forming the organic photoelectric conversion layer, a temperature equal to or higher than a tolerable temperature of the organic photoelectric conversion layer, for example, a high temperature at the time of performing a solder reflow process, etc., is not applied to the organic photoelectric conversion layer.

A photoelectric conversion device according to an embodiment of the present disclosure includes: an organic photoelectric conversion section provided on a first surface side of a substrate that includes two opposing surfaces and including a first electrode, an organic photoelectric conversion layer, and a second electrode in order from the substrate; and an electrode section provided on a second surface side of the substrate and used for external connection.

A solid-state imaging unit according to an embodiment of the present disclosure includes, as a pixel, the photoelectric conversion device according to the embodiment of the present disclosure described above.

An electronic apparatus according to an embodiment of the present disclosure includes the solid-state imaging unit including, as a pixel, the photoelectric conversion device according to the embodiment of the present disclosure described above.

In the photoelectric conversion device, the solid-state imaging unit, and the electronic apparatus according to the embodiments of the present disclosure, the organic photoelectric conversion section including the first electrode, the organic photoelectric conversion layer, and the second electrode is provided on the first surface side of the substrate, and the electrode section used for the external connection is provided on the second surface side of the substrate. Accordingly, a temperature equal to or higher than the tolerable temperature of the organic photoelectric conversion layer, for example, the high temperature at the time of performing a solder reflow process, etc., is not applied to the organic photoelectric conversion layer, in a manufacturing process.

According to the method of manufacturing the photoelectric conversion device according to the embodiment of the present disclosure, the organic photoelectric conversion layer and the second electrode are formed on the first electrode after the first electrode is formed on the first surface side of the substrate and the electrode section used for the external connection is formed on the second surface side. Accordingly, exposure of the organic photoelectric conversion layer to a high-temperature environment is suppressed. Therefore, it is possible to suppress degradation in the organic photoelectric conversion layer.

According to the photoelectric conversion device, the solid-state imaging unit, and the electronic apparatus of the embodiments of the present disclosure, the organic photoelectric conversion section including the first electrode, the organic photoelectric conversion layer, and the second electrode is provided on the first surface side of the substrate, and the electrode section used for the external connection is provided on the second surface side of the substrate. Accordingly, it is possible to suppress degradation in the organic photoelectric conversion layer in the manufacturing process.

MODES FOR CARRYING OUT THE INVENTION

Figure 1:
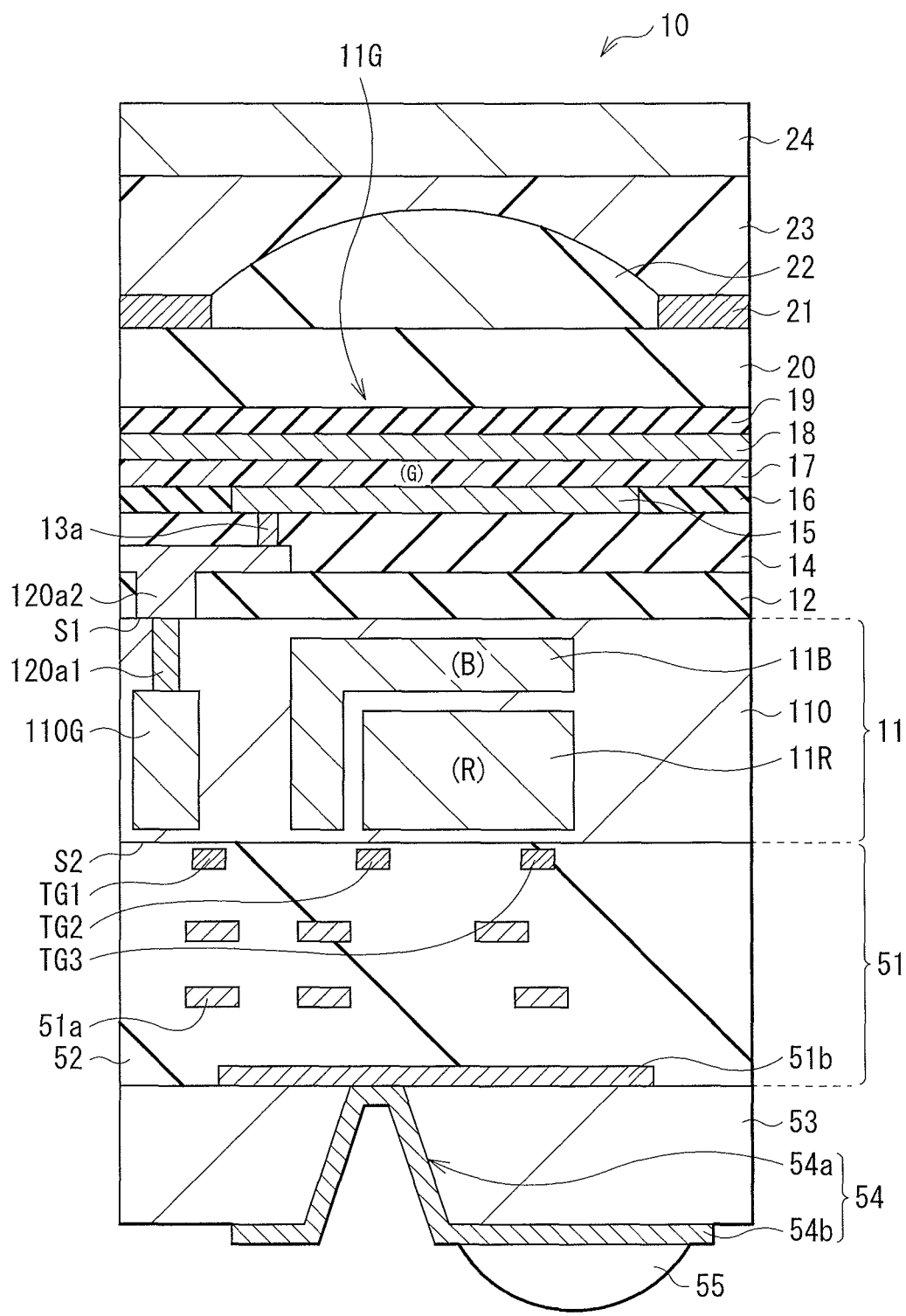
FIG. 1 is a cross-sectional view illustrating a configuration of a photoelectric conversion device according to an embodiment of the present disclosure.

An embodiment of the present disclosure will be described below in detail referring to the drawings. It is to be noted that the description will be provided in the following order.
1. Embodiment (an example of a photoelectric conversion device formed by attaching a lens component including an organic photoelectric conversion layer to a device substrate after forming a solder bump)
2. Modification 1 (an example of a case where the organic photoelectric conversion layer is formed on the device substrate side)
3. Modification 2 (an example in which attaching is performed with the use of a conductive adhesive layer)
4. Modification 3 (an example in which a stress moderating layer is provided)
5. Application Example 1 (an example of a solid-state imaging unit)
6. Application Example 2 (an example of an electronic apparatus (camera))

EMBODIMENT

Configuration

FIG. 1 illustrates a cross-sectional configuration of a photoelectric conversion device (a photoelectric conversion device 10) according to an embodiment of the present disclosure. The photoelectric conversion device 10 configures a pixel in a solid-state imaging unit (which will be described later) such as a CCD (Charge Coupled Device) or a CMOS (Complementary Metal Oxide Semiconductor).

The photoelectric conversion device 10 includes pixel transistors (including transfer transistors Tr1 to Tr3 which will be described later) that are formed on a front surface (a surface S2 opposite from a light receiving surface) side of a semiconductor substrate 11, and includes a multi-layered wiring layer (a multi-layered wiring layer 51).

This photoelectric conversion device 10 has a structure in which an organic photoelectric conversion section and an inorganic photoelectric conversion section are laminated in a vertical direction. The organic and inorganic photoelectric conversion sections selectively detect light having wavelength ranges different from each other and perform photoelectric conversion thereon. Thus, the solid-state imaging unit described later is allowed to acquire a plurality of types of color signals in one pixel without using a color filter. In the present embodiment, the photoelectric conversion device 10 has a lamination structure that includes one organic photoelectric conversion section 11G and two inorganic photoelectric conversion sections 11B and 11R. The photoelectric conversion device 10 acquires color signals of red (R), green (G), and blue (B) by such a lamination structure. The organic photoelectric conversion section 11G is formed on a back surface (a surface S1) side of the semiconductor substrate 11. The inorganic photoelectric conversion sections 11B and 11R are formed to be embedded in the semiconductor substrate 11. It is to be noted that the semiconductor substrate 11 corresponds to a specific example of "substrate" in the present disclosure. Configurations of the sections will be described below.

[Semiconductor Substrate 11]

The semiconductor substrate 11 may configured of, for example, a n-type silicon (Si) layer 110 and the inorganic photoelectric conversion sections 11B and 11R and a green electric storage layer 110G. The inorganic photoelectric conversion sections 11B and 11R and the green electric storage layer 110G are formed to be embedded in a predetermined region of the n-type silicon layer 110. Also, a conductive plug 120a1 is embedded in the semiconductor substrate 11. The conductive plug 120a1 is to be a transmission path of an electric charge (an electron or a hole) from the organic photoelectric conversion section 11G. In the present embodiment, the back surface (the surface S1) of this semiconductor substrate 11 serves as a light receiving surface. On the front surface (the surface S2) side of the semiconductor substrate 11, a plurality of pixel transistors (including the transfer transistors Tr1 to Tr3) corresponding to the organic photoelectric conversion section 11G and the inorganic photoelectric conversion sections 11B and 11R, are formed, and a peripheral circuit configured of a logic circuit, etc. are formed.

As the pixel transistors, for example, a transfer transistor, a reset transistor, an amplifying transistor, and a selection transistor may be mentioned. Each of these transistors may be configured, for example, of an MOS transistor, and is formed in a p-type semiconductor well region on the surface S2 side. A circuit that includes such pixel transistors is formed for each of the photoelectric conversion sections for red, green, and blue. Each of the circuits may have a three-transistor configuration that includes three transistors in total that may be configured, for example, of the transfer transistor, the reset transistor, and the amplifying transistor out of these pixel transistors. Each of the circuits may have a four-transistor configuration that includes the selection transistor in addition thereto. Here, out of these pixel transistors, only the transfer transistors Tr1 to Tr3 are illustrated. It is to be noted that the pixel transistor other than the transfer transistors may be shared by the photoelectric conversion sections or by the pixels. Further, a so-called a pixel-shared structure may be also adopted in which a floating diffusion is shared.

The transfer transistors Tr1 to Tr3 are each configured to include a gate electrode (a gate electrode TG1, TG2, or TG3) and a floating diffusion (FD113, FD114, or FD116). The transfer transistor Tr1 transfers, to a vertical signal line Lsig which will be described later, a signal charge (an electron, in the present embodiment) corresponding to green that is generated in the organic photoelectric conversion section 11G and is accumulated in the green electric storage layer 110G. The transfer transistor Tr2 transfers, to the vertical signal line Lsig which will be described later, a signal charge (an electron, in the present embodiment) corresponding to blue that is generated and accumulated in the inorganic photoelectric conversion section 11B. Similarly, the transfer transistor Tr3 transfers, to the vertical signal line Lsig which will be described later, a signal charge (an electron, in the present embodiment) corresponding to red that is generated and accumulated in the inorganic photoelectric conversion section 11R.

The inorganic photoelectric conversion sections 11B and 11R are each a photodiode that has a pn junction. The inorganic photoelectric conversion sections 11B and 11R are formed in order from the surface S1 side on an optical path in the semiconductor substrate 11. Out of these, the inorganic photoelectric conversion section 11B selectively detects blue light and accumulates a signal charge corresponding to blue. The inorganic photoelectric conversion section 11B may be formed to extend, for example, from a selective region along the surface S1 of the semiconductor substrate 11 to a region near an interface with the multi-layered wiring layer 51. The inorganic photoelectric conversion section 11R selectively detects red light and accumulates a signal charge corresponding to red. The inorganic photoelectric conversion section 11R may be formed, for example, in a region in a lower layer (on the surface S2 side) compared to the inorganic photoelectric conversion section 11B. It is to be noted that blue (B) may be a color that corresponds to a wavelength range from 450 nm to 495 nm, for example, and red (R) may be a color that corresponds to a wavelength range from 620 nm to 750 nm, for example. It is enough that the inorganic photoelectric conversion sections 11B and 11R are capable of detecting light in part or all of the respective wavelength ranges described above.

Figure 2A:
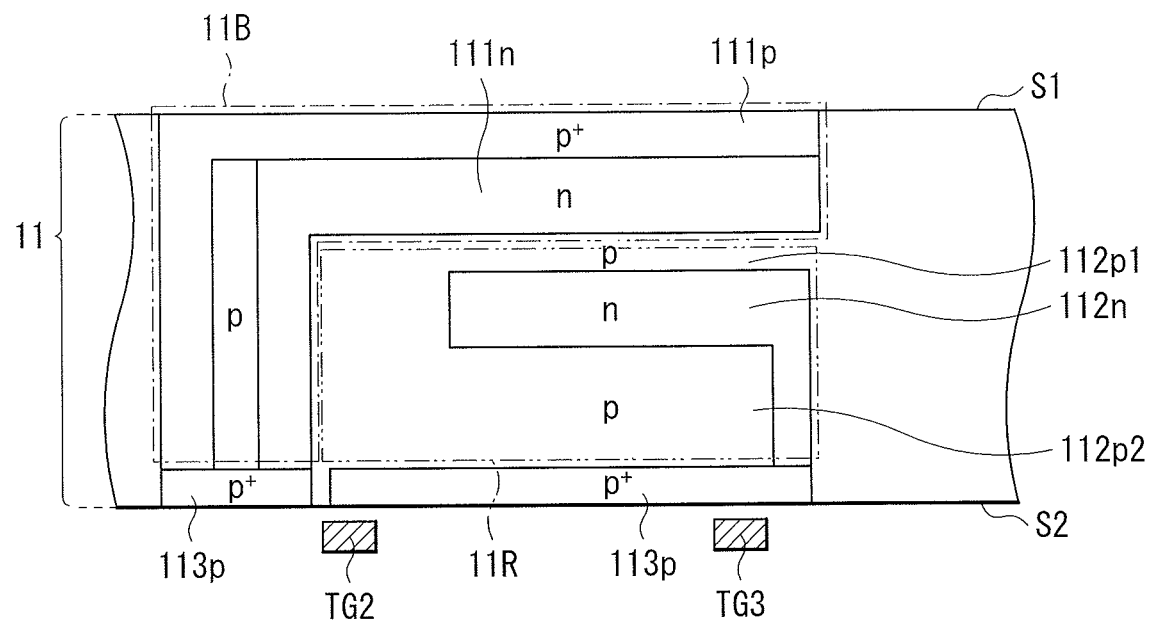
FIG. 2A is a cross-sectional view illustrating a configuration example of an inorganic photoelectric conversion section.
Figure 2B:
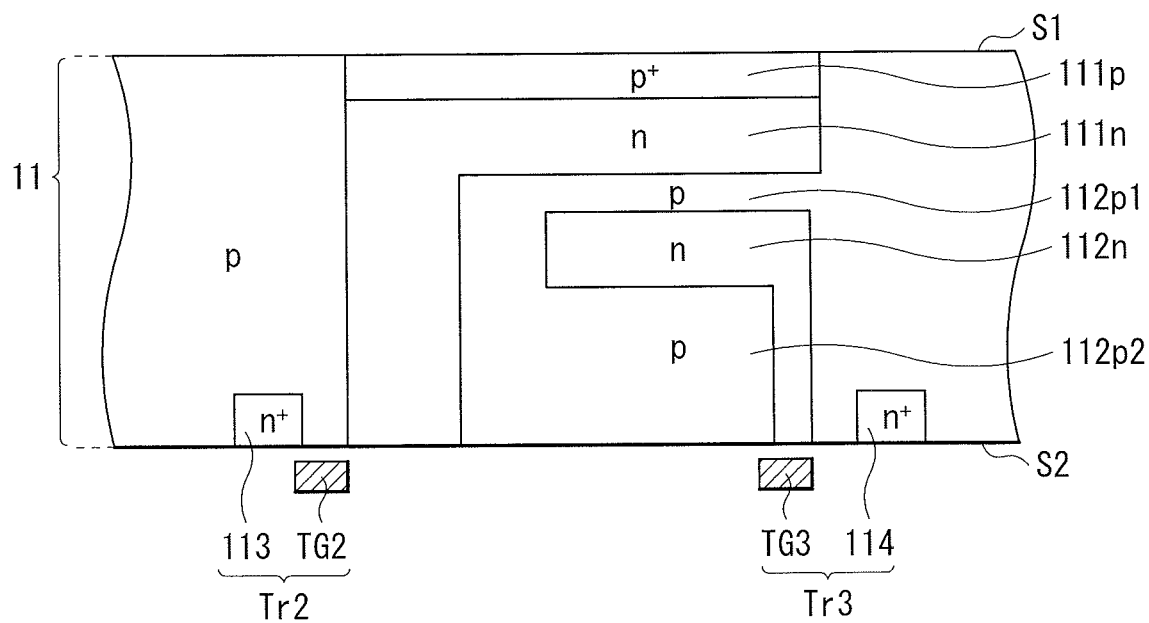
FIG. 2B is a cross-sectional view illustrating the configuration example of the inorganic photoelectric conversion section.

FIG. 2A illustrates a detailed configuration example of the inorganic photoelectric conversion sections 11B and 11R. FIG. 2B corresponds to a configuration in another cross-section in FIG. 2A. It is to be noted that, in the present embodiment, description will be provided of a case where, out of a pair of an electron and a hole generated by photoelectric conversion, the electron is read as a signal charge (a case where an n-type semiconductor region serves as a photoelectric conversion layer). Further, in the drawing, "+(plus)" attached above "p" or "n" represents that p-type or n-type impurity concentration is high. Also, out of the pixel transistors, the gate electrodes TG2 and TG3 of the transfer transistors Tr2 and Tr3 are shown.

The inorganic photoelectric conversion section 11B may be configured to include, for example, a p-type semiconductor region (hereinafter, simply referred to as "p-type region", and the same is applicable to the case of n-type) 111p to be a hole accumulation layer, and an n-type photoelectric conversion layer (an n-type region) 111n to be an electron accumulation layer. The p-type region 111p and the n-type photoelectric conversion layer 111n are each formed in a selective region near the surface S1. Part of each of the p-type region 111p and the n-type photoelectric conversion layer 111n is bent and formed to extend to reach the interface with the surface S2. The p-type region 111p is connected to a p-type semiconductor well region which is not illustrated on the surface S1 side. The n-type photoelectric conversion layer 111n is connected to the FD 113 (an n-type region) of the transfer transistor Tr2 for blue. It is to be noted that a p-type region 113p (a hole accumulation layer) is formed near an interface of the surface S2 and each of the end portions on the surface S2 side of the p-type region 111p and the n-type photoelectric conversion layer 111n.

The inorganic photoelectric conversion section 11R may be formed, for example, of p-type regions 112p1 and 112p2 (hole accumulation layers) and an n-type photoelectric conversion layer 112n (an electron accumulation layer) sandwiched therebetween (has a p-n-p laminated structure). Part of the n-type photoelectric conversion layer 112n is bent and formed to extend to reach the interface with the surface S2. The n-type photoelectric conversion layer 112n is connected to the FD 114 (an n-type region) of the transfer transistor Tr3 for red. It is to be noted that a p-type region 113p (a hole accumulation layer) is formed at least near an interface of the surface S2 and an end portion on the surface S2 side of the n-type photoelectric conversion layer 111n.

Figure 3:
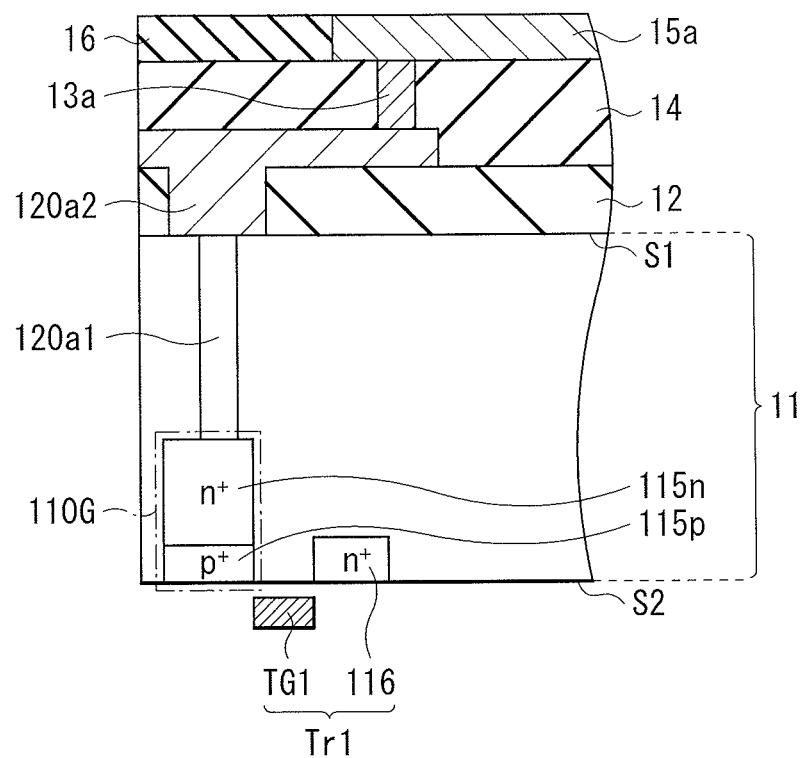
FIG. 3 is a cross-sectional view illustrating a configuration example of a charge (electron) accumulation layer of an organic photoelectric conversion section.

FIG. 3 illustrates a detailed configuration example of the green electric storage layer 110G. It is to be noted that, here, description will be provided of a case where, out of a pair of an electron and a hole generated by the organic photoelectric conversion section 11G, the electron is read as a signal charge from a lower electrode 15 side. Also, FIG. 3 shows the gate electrode TG1 of the transfer transistor Tr1 out of the pixel transistors.

The green electric storage layer 110G is configured to include an n-type region 115n that is to be an electron accumulation layer. Part of the n-type region 115n is connected to the conductive plug 120a1, and is configured to accumulate an electron supplied from the lower electrode 15 side via the conductive plug 120a1. This n-type region 115n is also connected to the FD 116 (an n-type region) of the transfer transistor Tr1 for green. It is to be noted that a p-type region 115p (a hole accumulation layer) is formed near an interface of the n-type region 115n and the surface S2.

The conductive plug 120a1, together with a conductive plug 120a2 which will be described later, serves as a connector between the organic photoelectric conversion section 11G and the semiconductor substrate 11, and form a transmission path for an electron or a hole generated in the organic photoelectric conversion section 11G. Here, the conductive plug 120a1 is conducted to the lower electrode 15 in the organic photoelectric conversion section 11G, and is connected to the green electric storage layer 110G.

The conductive plug 120a1 may be configured, for example, of a conductive-type semiconductor layer, and may be formed to be embedded in the semiconductor substrate 11. In this case, the conductive plug 120a1 may be favorably of an n-type since the conductive plug 120a1 is to be the transmission path of an electron. Alternatively, the conductive plug 120a1 may be configured, for example, of a conductive film material such as tungsten embedded in a through via. In this case, for example, in order to suppress short circuit with silicon, a side face of the via may be desirably covered with an insulating film made of silicon oxide ($SiO_2$), silicon nitride (SiN), or the like.

For example, a support substrate 53 made of silicon may be provided on the surface S2 side of the semiconductor substrate 11 as described above with the multi-layered wiring layer 51 in between. On this support substrate 53, a through electrode 54 and a solder bump 55 (an electrode section) are formed.

[Multi-Layered Wiring Layer 51]

The multi-layered wiring layer 51 is formed on the surface S2 of the semiconductor substrate 11 described above. In the multi-layered wiring layer 51, a plurality of wirings 51a and a wiring 51b are arranged with an interlayer insulating film 52 in between. Thus, the multi-layer wiring layer 51 is formed on the opposite side from the light receiving surface in the photoelectric conversion device 10. Accordingly, a solid-state imaging unit of a so-called back surface illumination type is achievable.

[Solder Bump 55]

The through electrode 54 and the solder bump 55 (the electrode section) are formed on the support substrate 53. The through electrode 54 is configured of a through via (TSV) 54a and a conductive film 54b. The through via 54a runs through the support substrate 53. The conductive film 54b covers inside of the through via 54a and is formed to extend to a surface of the support substrate 53. The conductive film 54b may be configured, for example, of copper (Cu), and is electrically connected to the wiring 51b in the multi-layered wiring layer 51.

The solder bump 55 may be an electrode for external connection that is used for, for example, connection between substrates (wafers). This solder bump 55 may be formed on the conductive film 54b of the through electrode 54, for example, in a hemispherical shape. The solder bump 55 may be configured to include, for example, one or more of lead (Pb), tin (Sn), gold (Au), silver (Ag), copper (Cu), and the like.

On the other hand, the organic photoelectric conversion section 11G is formed on the surface S1 side of the semiconductor substrate 11. Description will be provided below of the configuration on the surface S1 side of the semiconductor substrate 11.

[Organic Photoelectric Conversion Section 11G]

The organic photoelectric conversion section 11G is an organic photoelectric conversion element that uses an organic semiconductor to absorb light having a selective wavelength range (here, green light) and to generate a pair of an electron and a hole. The organic photoelectric conversion section 11G has a configuration in which an organic photoelectric conversion layer 17 is sandwiched between the pair of electrodes (the lower electrode 15 and the upper electrode 18) for extracting a signal charge. The lower electrode 15 (first electrode) is electrically connected to the conductive plug 120a1 that is embedded in the semiconductor substrate 11. The upper electrode 18 (second electrode) is connected to the wiring 51a via a wiring layer, a contact metal layer, etc. which are not illustrated, for example, in a peripheral edge portion of the solid-state imaging unit. Thus, a charge (in this example, a hole) is discharged.

This organic photoelectric conversion section 11G is formed on the surface S1 of the semiconductor substrate 11 with interlayer insulating films 12 and 14 in between. A conductive plug 120a1 is embedded in the interlayer insulating film 12 in a region that opposes the conductive plug 120a1. A wiring layer 13a is embedded in the interlayer insulating film 14 in a region that opposes the conductive plug 120a2. On this interlayer insulating film 14, the lower electrode 15 is provided in a manner being electrically separated for each device (pixel) by an insulating film 16. An organic photoelectric conversion layer 17 is formed on the lower electrode 15 and the insulating film 16. The upper electrode 18 is provided to cover the organic photoelectric conversion layer 17. A protective film 19 and a planarization layer 20 are laminated on the upper electrode 18. It is to be noted that the organic photoelectric conversion layer 17 may have a groove in a region between the pixels, which is not illustrated. In other words, the organic photoelectric conversion layer 17 itself may be separated for each pixel. The groove may be provided as necessary since characteristics of each pixel may be improved thereby in some cases. Further, in this case, the insulating film 16 may be formed on the groove (in the groove). This does not prevent the device from operating.

The conductive plug 120a2 serves as a connector together with the conductive plug 120a1 as described above. Also, the conductive plug 120a2 forms a transmission path of a charge (an electron) from the lower electrode 15 to the green electric storage layer 110G, together with the conductive plug 120a1 and the wiring layer 13a. In order to allow the conductive plug 120a2 to serve as a light blocking film, the conductive plug 120a2 each may be desirably configured, for example, of a laminated film of metal materials such as titanium (Ti), titanium nitride (TiN), and tungsten. Also, it may be desirable to use such a laminated film since contact with silicon is allowed to be thereby secured even in a case where the conductive plugs 120a1 and 120b1 are each formed as an n-type or p-type semiconductor layer.

The interlayer insulating film 12 may be desirably configured of an insulating film that has low interface state in order to decrease interface state with the semiconductor substrate 11 (the silicon layer 110) and to suppress occurrence of a dark current from the interface with the silicon layer 110. As such an insulating film, for example, a laminated film of a hafnium-oxide ($HfO_2$) film and a silicon oxide ($SiO_2$) film may be used. The interlayer insulating film 14 may be configured, for example, of a single-layer film configured of one of silicon oxide, silicon nitride, silicon oxynitride (SiON), etc., or a laminated film configured of two or more thereof.

The insulating film 16 may be configured, for example, of a single-layer film configured of one of silicon oxide, silicon nitride, silicon oxynitride (SiON), etc., or a laminated film configured of two or more thereof. In the present embodiment, the insulating film 16 has a planarized surface, and has a shape and a pattern that have almost no level difference with the lower electrode 15. This insulating film 16 has a function of electrically separating the lower electrodes 15 in the respective pixels when the photoelectric conversion devices 10 are used as pixels in a solid-state imaging unit.

The lower electrode 15 exactly opposes the light receiving surfaces of the inorganic photoelectric conversion sections 11B and 11R formed in the semiconductor substrate 11, and is provided in a region that covers light receiving surfaces thereof. This lower electrode 15 is configured of a conductive film that has light transmission characteristics, and may be configured, for example, of ITO (indium-tin oxide). However, as a configuration material of the lower electrode 15, a tin-oxide ($SnO_2$)-based material added with a dopant, or a zinc-oxide-based material obtained by adding a dopant to aluminum-zinc oxide (ZnO) may be used other than the ITO. As the zinc-oxide-based material, for example, aluminum-zinc oxide (AZO) in which aluminum (Al) is added as a dopant, gallium-zinc oxide (GZO) in which gallium (Ga) is added, and indium-zinc oxide (IZO) in which indium (In) is added may be mentioned. Alternatively, other than these materials, CuI, $InSbO_4$, ZnMgO, $CuInO_2$, $MgIn_2O_4$, CdO, $ZnSnO_3$, etc. may be used. It is to be noted that, in the present embodiment, the signal charge (the electron) is extracted from the lower electrode 15 as described above. Therefore, this lower electrode 15 is formed separately for each pixel in the solid-state imaging unit that uses the photoelectric conversion device 10 as a pixel which will be described later.

The organic photoelectric conversion layer 17 is configured of an organic semiconductor that performs photoelectric conversion on light having a selective wavelength range, and on the other hand, transmits light having other wavelength range. The organic semiconductor may be desirably configured to include one or both of an organic p-type semiconductor and an organic n-type semiconductor. As such an organic semiconductor, one of quinacridone derivatives, naphthalene derivatives, anthracene derivatives, phenanthrene derivatives, tetracene derivatives, pyrene derivatives, perylene derivatives, and fluoranthene derivatives may be favorably used. Alternatively, a polymer such as phenylene vinylene, fluorene, carbazole, indole, pyrene, pyrrole, picoline, thiophene, acethylene, and diacethylene, or a derivative thereof may be used. In addition thereto, polycondensed aromatic series, polycondensed aromatic rings, and chain compounds in which heterocyclic compounds are condensed such as metal complex dyes, cyanine-based dyes, merocyanine-based dyes, phenylxanthene-based dyes, triphenylmethane-based dyes, rhodacyanine-based dyes, xanthene-based dyes, macrocyclic azaanulene-based dyes, azulene-based dyes, naphthoquinone, anthraquinone-based dyes, anthracene, and pyrene, two nitride-containing heterocyclic rings such as quinolone, benzothiazole, and benzoxazole that have a squarylium group and a chroconic methine group as bonding chains, cyanine-based-like dyes combined with a squarylium group and a chroconic methine group, etc. may be preferably used. It is to be noted that, as the above-described metal complex dye, a dithiol-metal-complex-based dye, a metal phthalocyanine dye, a metal porphyrin dye, or a ruthenium complex dye may be preferable. However, the metal complex dye is not limited thereto. In the present embodiment, the organic photoelectric conversion layer 17 may be capable of performing photoelectric conversion, for example, of green light corresponding to part or all of a wavelength range from 495 nm to 570 nm. Such an organic photoelectric conversion layer 17 may have a thickness, for example, from 50 nm to 500 nm.

Other layer which is not illustrated may be provided between this organic photoelectric conversion layer 17 and the lower electrode 15 and between this organic photoelectric conversion layer 17 and the upper electrode 18. For example, an underlying film, an electron blocking film, the organic photoelectric conversion layer 17, a hole blocking film, a buffer film, and a work function adjustment film may be laminated in order from the lower electrode 15 side.

In the present embodiment, the surface of the lower electrode 15 is planarized (the lower electrode 15 has a planarized surface), and the organic photoelectric conversion layer 17 is formed along this surface of the lower electrode 15. Specifically, the surface of the lower electrode 15 that opposes the organic photoelectric conversion layer 17 and the surface of the organic photoelectric conversion layer 17 that opposes the lower electrode 15 each form a planarized surface. Further, the insulating film 16 is formed in the same layer as the lower electrode 15. Also, a surface of the insulating film 16 on the organic photoelectric conversion layer 17 side is planarized, and is formed to have no level difference with the lower electrode 15. This is because the organic photoelectric conversion layer 17 is formed by attaching the organic photoelectric conversion layer 17 onto the lower electrode 15, which will be described later in detail. Moreover, each of the opposing surfaces of the lower electrode 15 and the organic photoelectric conversion layer 17 may desirably have planarization characteristics to an extent that achieves, for example, RMS (Root Mean Square) granularity of 1 nm or smaller.

The upper electrode 18 is configured of a conductive film that has light transmission characteristics similar to those of the lower electrode 15. In the present embodiment, the hole extracted from the upper electrode 18 is discharged as described above. Therefore, in the solid-state imaging unit that uses the photoelectric conversion device 10 as a pixel, this upper electrode 18 may be separated for each pixel, or this upper electrode 18 may be formed as an electrode common to the respective pixels. The upper electrode 18 may have a thickness, for example, from 10 nm to 200 nm.

The protective film 19 may be configured, for example, of an inorganic material that has light transmission characteristics, and may be a single-layer film configured of one of silicon oxide, silicon nitride, silicon oxynitride, etc., or a laminated film configured of two or more thereof. This protective film 19 may have a thickness, for example, from 100 nm to 30000 nm.

The planarization layer 20 may be configured, for example, of an acrylic-based resin material, a styrene-based resin material, an epoxy-based resin material, or the like. An on-chip lens 22 is provided on this planarization layer 20. It is to be noted that the planarization layer 20 may be provided as necessary, and the above-described protective layer 19 may also serve as the planarization layer 20.

[On-Chip Lens 22]

The on-chip lens 22 condenses light incident from the above to the respective light receiving surfaces of the organic photoelectric conversion layer 11G and the inorganic photoelectric conversion layers 11B and 11R. In the present embodiment, the multi-layered wiring layer 51 is formed on the surface S2 side of the semiconductor substrate 11. Therefore, the light receiving surfaces of the organic photoelectric conversion layer 11G and the inorganic photoelectric conversion layers 11B and 11R are allowed to be arranged close to each other. Accordingly, it is possible to reduce variation in sensitivity between colors that is caused depending on an F number of the on-chip lens 22.

A light blocking film 21 is formed in a peripheral edge region of this on-chip lens 22. The light blocking film 21 may be provided in a matrix pattern on the planarization layer 20, and the on-chip lens 22 may be formed in each opening in the matrix pattern, for example, in the solid-state imaging unit described later. A cover glass 24 is arranged on the on-chip lens 22 and the light blocking film 21 to oppose them. A region between the on-chip lens 22 and the cover glass 24 is not an empty space, but is filled with an adhesive layer 23.

The light blocking film 21 may be desirably configured, for example, of a material that has low transmittance with respect to visible light such as tungsten (W), titanium (Ti), aluminum (Al), or copper (Cu). However, the light blocking film 21 may be configured of a material that has transmittance not low with respect to the visible light. In this case, necessary light blocking characteristics are secured, for example, by increasing the thickness thereof. The on-chip lens 22 may be configured, for example, of silicon nitride, zinc oxide, zirconium oxide, zircon, diamond-like carbon, or the like that has refractive index from about 1.8 to 2.0. However, the material of the on-chip lens 22 is not limited thereto. In addition thereto, the material of the on-chip lens 22 may be an inorganic material or an organic material as long as the material secures a difference in refractive index from the adhesive layer 23 to be 0.4 or larger, desirably, 0.6 or larger, and has high transmittance with respect to the visible light. The adhesive layer 23 may be configured, for example, of an organic material having a refractive index of about 1.5 such as acrylic-based resin, epoxy-based resin, styrene-based resin, or the like. The cover glass 24 may have, for example, a thickness from 10 μm to 50 μm. However, the thickness of the cover glass 24 is set based on the area, the height, or the like of the on-chip lens 22. The cover glass 24 may have any thickness that is equal to or larger than a thickness that allows the cover glass 24 not to contact the on-chip lens 22 when the cover-glass is adhered.

[Manufacturing Method]

The photoelectric conversion device 10 as described above may be manufactured as follows, for example. FIGS. 4 to 16 illustrate a method of manufacturing the photoelectric conversion device 10. Out of these drawings, FIGS. 4 to 12 illustrate steps of forming the device substrate, FIGS. 13A to 15 illustrate steps of forming the lens component, and FIG. 16 illustrates a step of attaching the device substrate A to the lens component B. It is to be noted that, in the present embodiment, in the device substrate A, the multi-layered wiring layer 51, the support substrate 53, the through electrode 54, and the solder bump 55 are formed on the surface S2 side of the semiconductor substrate 11, and the lower electrode 15 and the insulating film 16 are formed on the surface S1 side thereof with the interlayer insulating films 12 and 14 in between. In the lens component B, the adhesive layer 23, the on-chip lens 22, the light blocking film 21, the planarization layer 20, the protective layer 19, the upper electrode 18, and the organic photoelectric conversion layer 17 are laminated on one surface side of the cover glass 24. Description will be provided below on detailed procedure of each of the step.

[1. Step of Forming Device Substrate]

Figure 4:
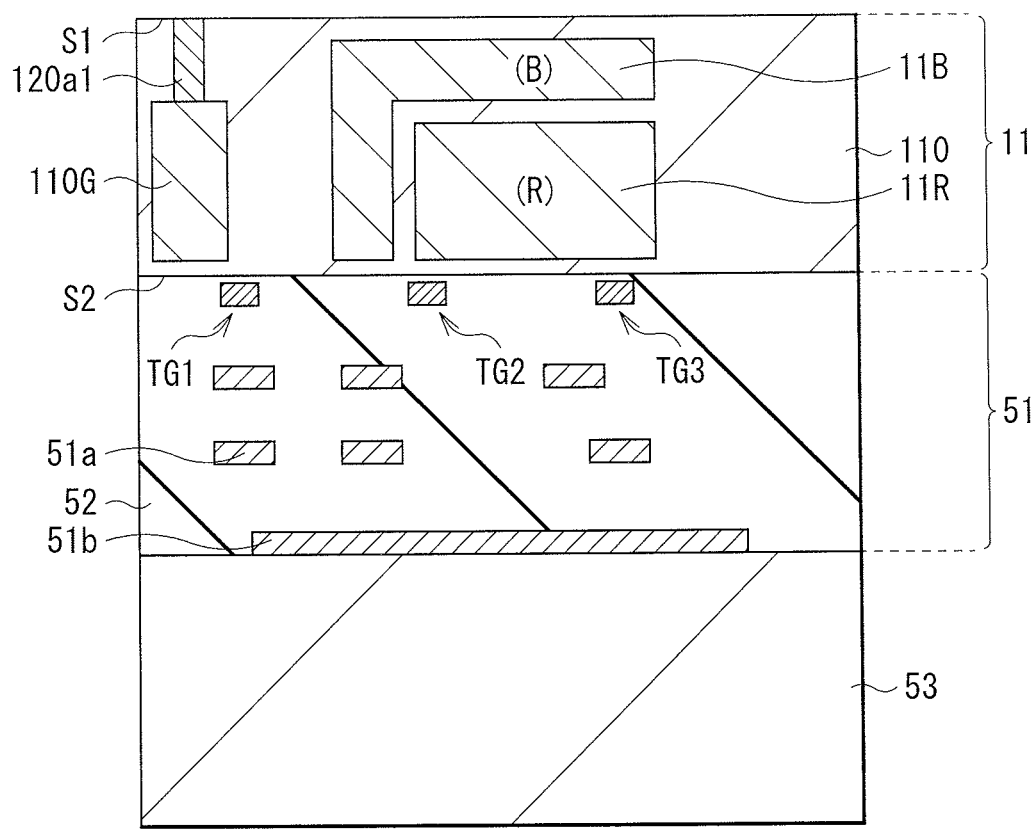
FIG. 4 is a cross-sectional view for explaining a step of forming a device substrate in a method of manufacturing the photoelectric conversion device shown in FIG. 1.

First, as shown in FIG. 4, the inorganic photoelectric conversion sections 11A and 11B are formed in the semiconductor substrate 11. Thereafter, the multi-layered wiring layer 51 is formed on the surface S2 of the semiconductor substrate 11, and the support substrate 53 is attached onto this multi-layered wiring layer 51. Specifically, first, the silicon layer 110 is formed on an unillustrated tentative substrate made of a silicon oxide film. The conductive plug 120a1, the green electric storage layer 110G, and the inorganic photoelectric conversion sections 11B and 11R may be formed in this silicon layer 110, for example, by ion injection. Subsequently, although not illustrated, the pixel transistors including the transfer transistors Tr1 to Tr3 and the peripheral circuits such as the logic circuit are formed on the surface S2 side of the semiconductor substrate 11. Subsequently, the plurality of layers of wirings 51a and 51b are formed on the surface S2 of the semiconductor substrate 11 with the interlayer insulating film 52 in between. Thus, the multi-layered wiring layer 51 is formed. Thereafter, the support substrate 53 made of silicon is attached onto the formed multi-layered wiring layer 51. It is to be noted that the above-described tentative substrate is peeled off from the surface S1 side of the semiconductor substrate 11 after attaching this support substrate 53, and thereby, the surface S1 of the semiconductor 11 is exposed.

Figure 5:
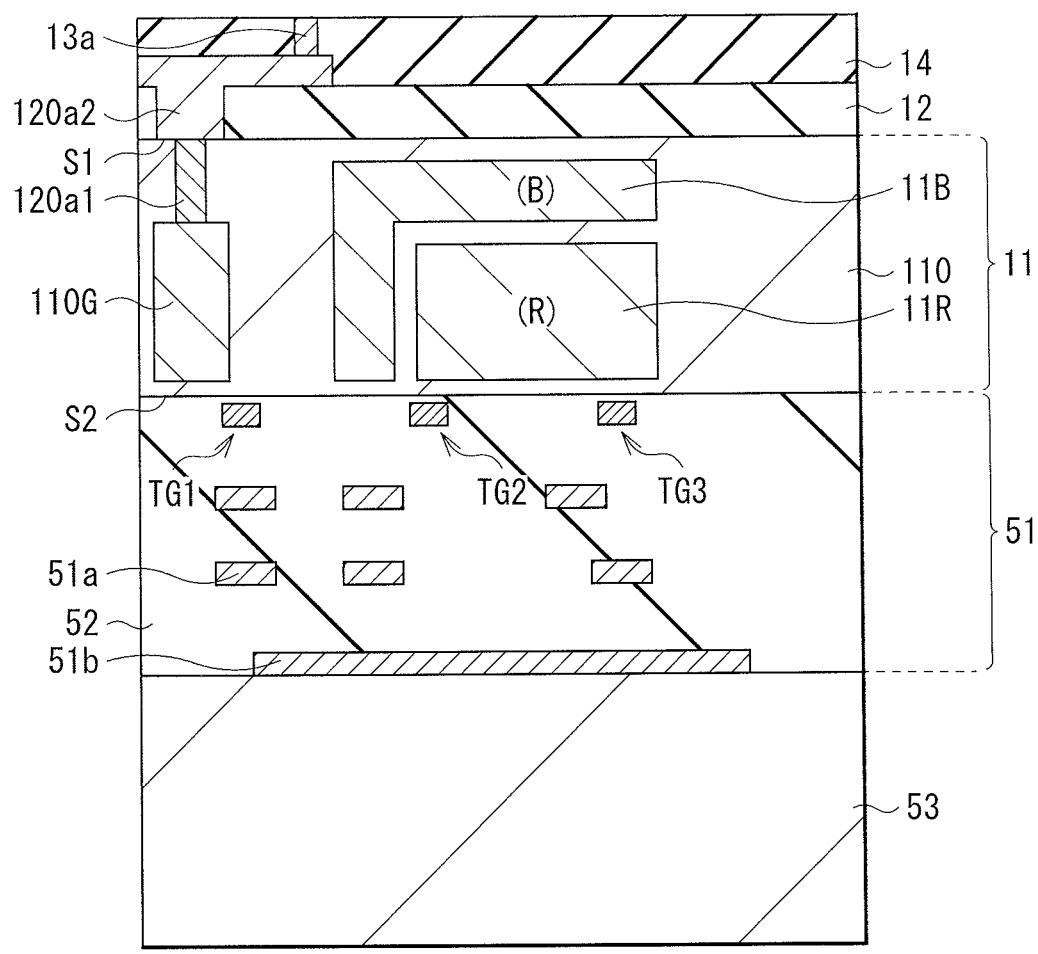
FIG. 5 is a cross-sectional view illustrating a step following a step shown in FIG. 4.

Next, as shown in FIG. 5, the interlayer insulating films 12 and 14 are formed on the surface S1 of the semiconductor substrate 11. Specifically, first, the interlayer insulating film 12 configured of the laminated film of the hafnium oxide film and a silicon oxide film as described above is formed on the surface S1 of the semiconductor substrate 11. At this time, for example, the hafnium oxide film may be formed by an ALD (Atomic Layer Deposition) method, and then, for example, the silicon oxide film may be formed by a plasma CVD (Chemical Vapor Deposition) method. Thereafter, a region, of the interlayer insulating film 12, that opposes the conductive plug 120a1 is opened, and the conducive plug 120a2 formed on the above-described material is formed. Subsequently, the interlayer insulating film 14 made of the above-described material may be formed, for example, by a plasma CVD method. Subsequently, a region, of the interlayer insulating film 14, that opposes the conductive plug 120a2 is opened, and the wiring layer 13a made of the above-described material is formed.

Figure 6:
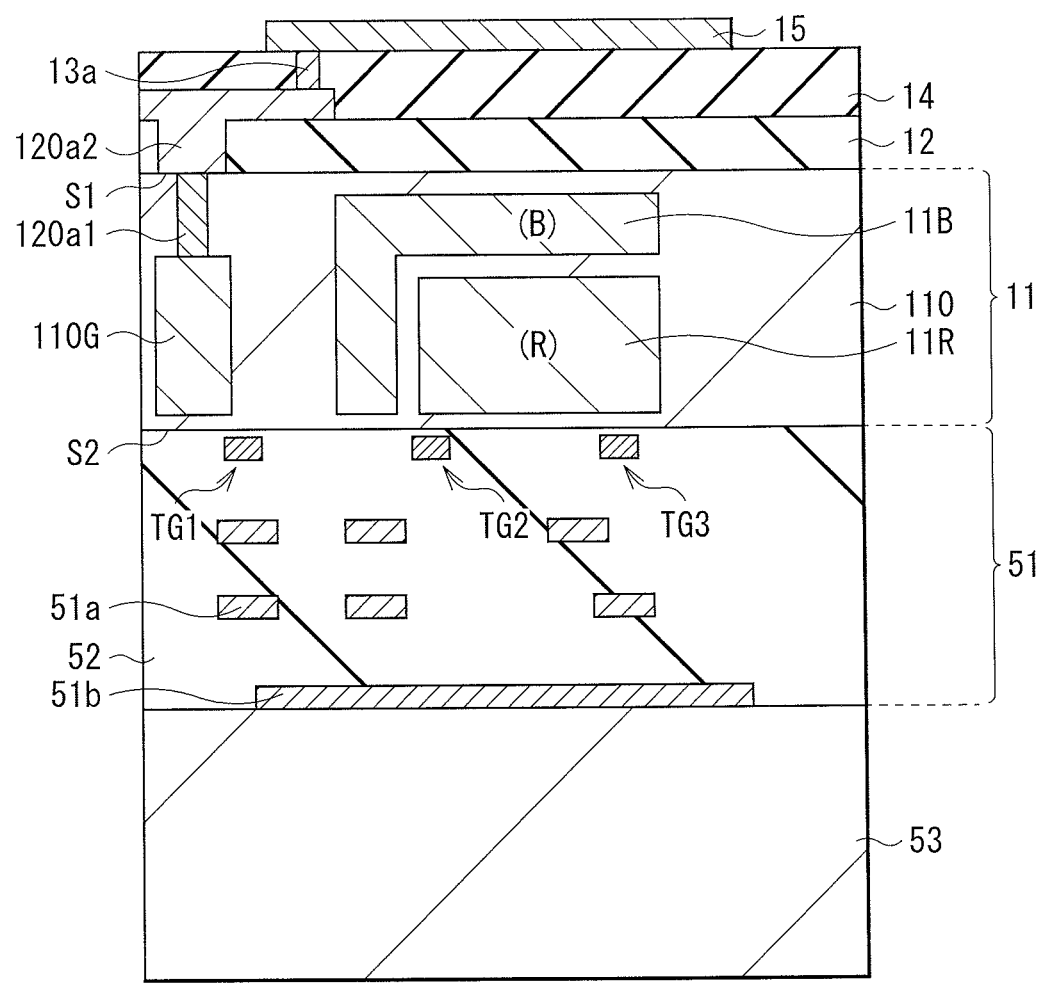
FIG. 6 is a cross-sectional view illustrating a step following the step shown in FIG. 5.

Subsequently, as shown in FIG. 6, the lower electrode 15 is formed on the interlayer insulating film 14. Specifically, first, the above-described transparent conductive film may be formed on the entire surface on the interlayer insulating film 14, for example, by a sputtering method. Thereafter, a photolithography method is used (exposure, development, postbake, etc. of a photoresist film is performed), and a selective part may be removed, for example, by dry etching or wet etching. Thus, the lower electrode 15 is formed. At this time, the lower electrode 15 is formed in a region that opposes the wiring layer 13a.

Figure 7:
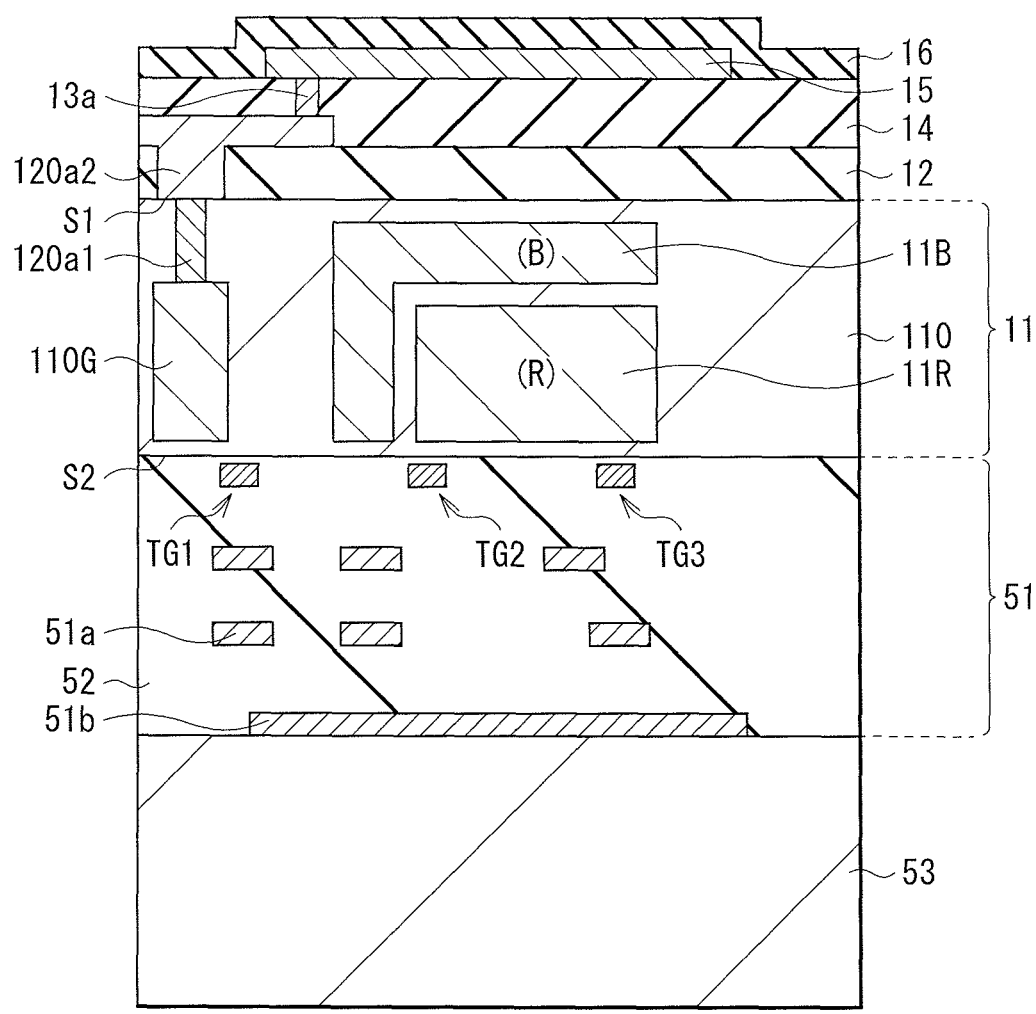
FIG. 7 is a cross-sectional view illustrating a step following the step shown in FIG. 6.
Figure 8:
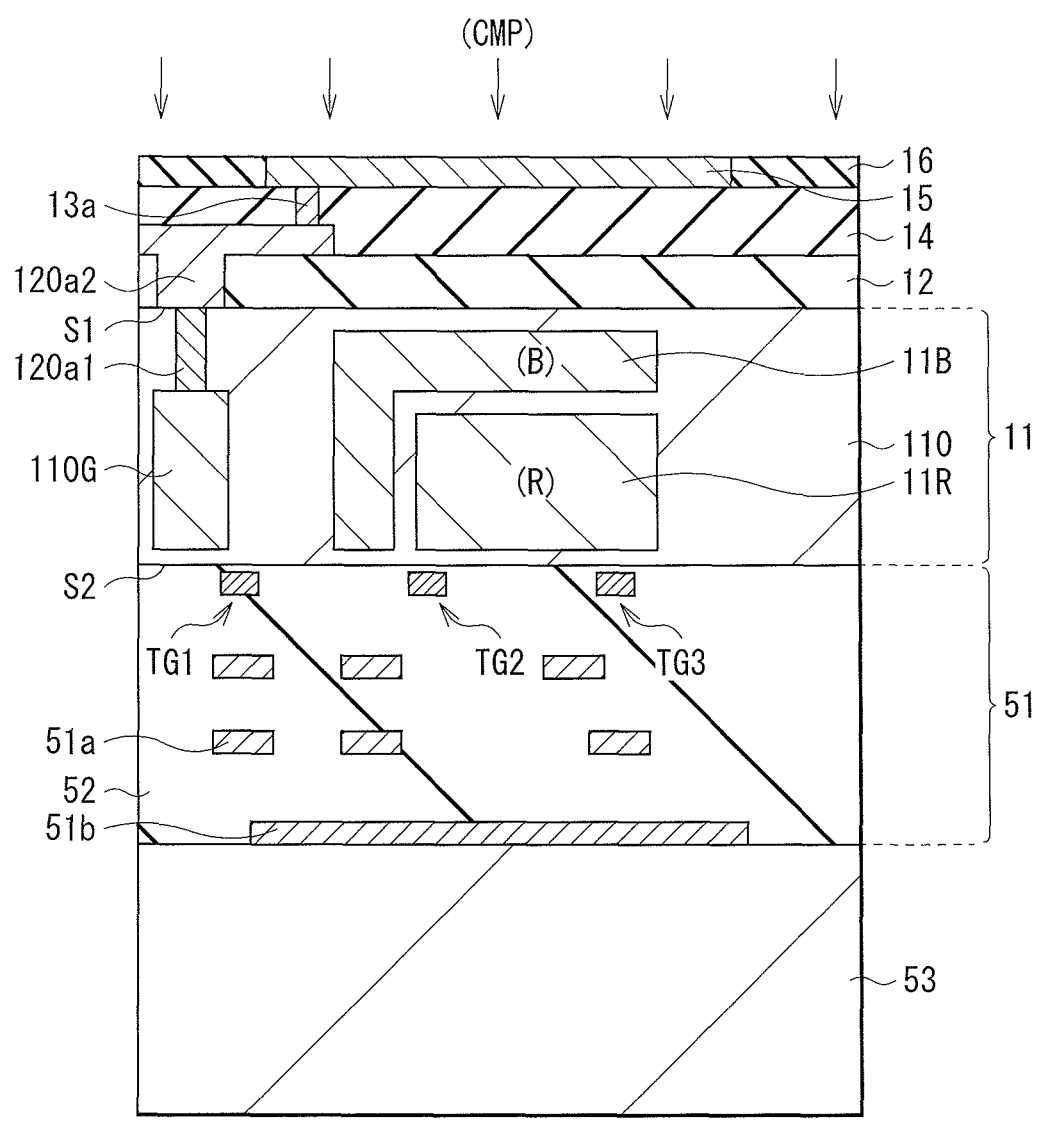
FIG. 8 is a cross-sectional view illustrating a step following the step shown in FIG. 7.

Subsequently, the insulating film 16 is formed. At this time, first, as shown in FIG. 7, the insulating film 16 made of the above-described material may be formed, for example, by a plasma CVD method on the entire surface on the semiconductor substrate 11 so as to cover the interlayer insulating film 14 and the lower electrode 15. Thereafter, as shown in FIG. 8, each of the surface of the formed insulating film 16 and the surface of the lower electrode 15 may be polished, for example, by a CMP (Chemical Mechanical Polishing) method. Thus, the lower electrode 15 is exposed from the insulating film 16, and a level difference between the lower electrode 15 and the insulating film 16 are moderated and each of the surfaces of the insulating film 16 and the lower electrode 15 is planarized.

[Tentative Fixing 1]

Figure 9:
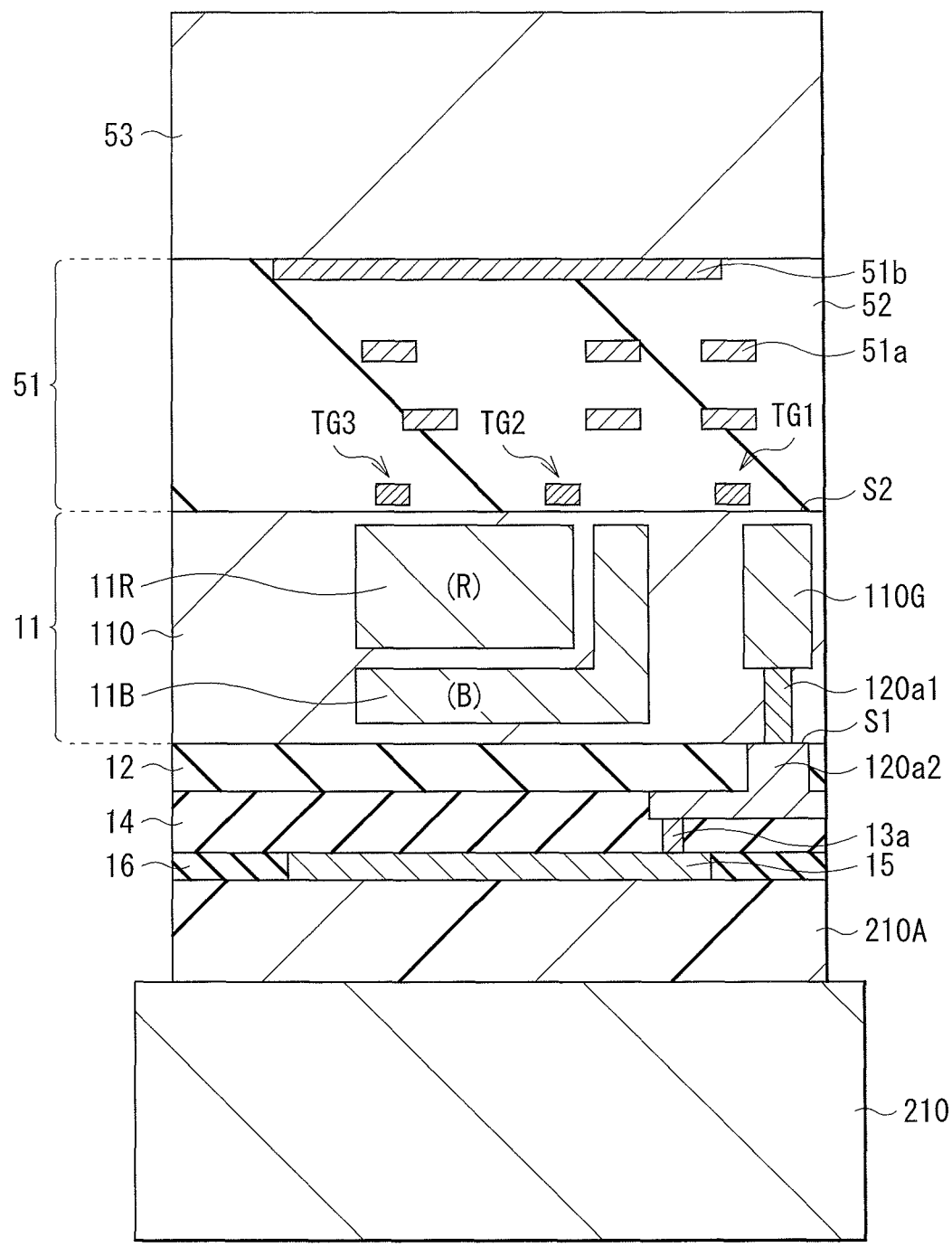
FIG. 9 is a cross-sectional view illustrating a step following the step shown in FIG. 8.

Subsequently, as shown in FIG. 9, the surface on the interlayer insulating film 14 side may be fixed (tentatively fixed), for example, onto a tentative substrate 210 made of quartz with the use of an adhesive layer 210A that is allowed to be peeled off (removed). In FIG. 9, illustration is made with the support substrate 53 on the upper side (in which the lamination structure shown in FIG. 8 is vertically inverted). As the adhesive layer 210A, for example, thermoplastic resin having a glass transition temperature (Tg), for example, from 130° C. to 200° C., specifically, about 150° C. may be mentioned. Alternatively, in a case where the tentative substrate 210 is peeled off (which will be described later) by a method not using the thermoplastic resin, for example, by a laser ablation method, a mechanical peeling-off method, or the like, any material in accordance with each of the method may be used which have no limitation in glass transition temperature as described above.

[Formation of Solder Bump 55]

Figure 10:
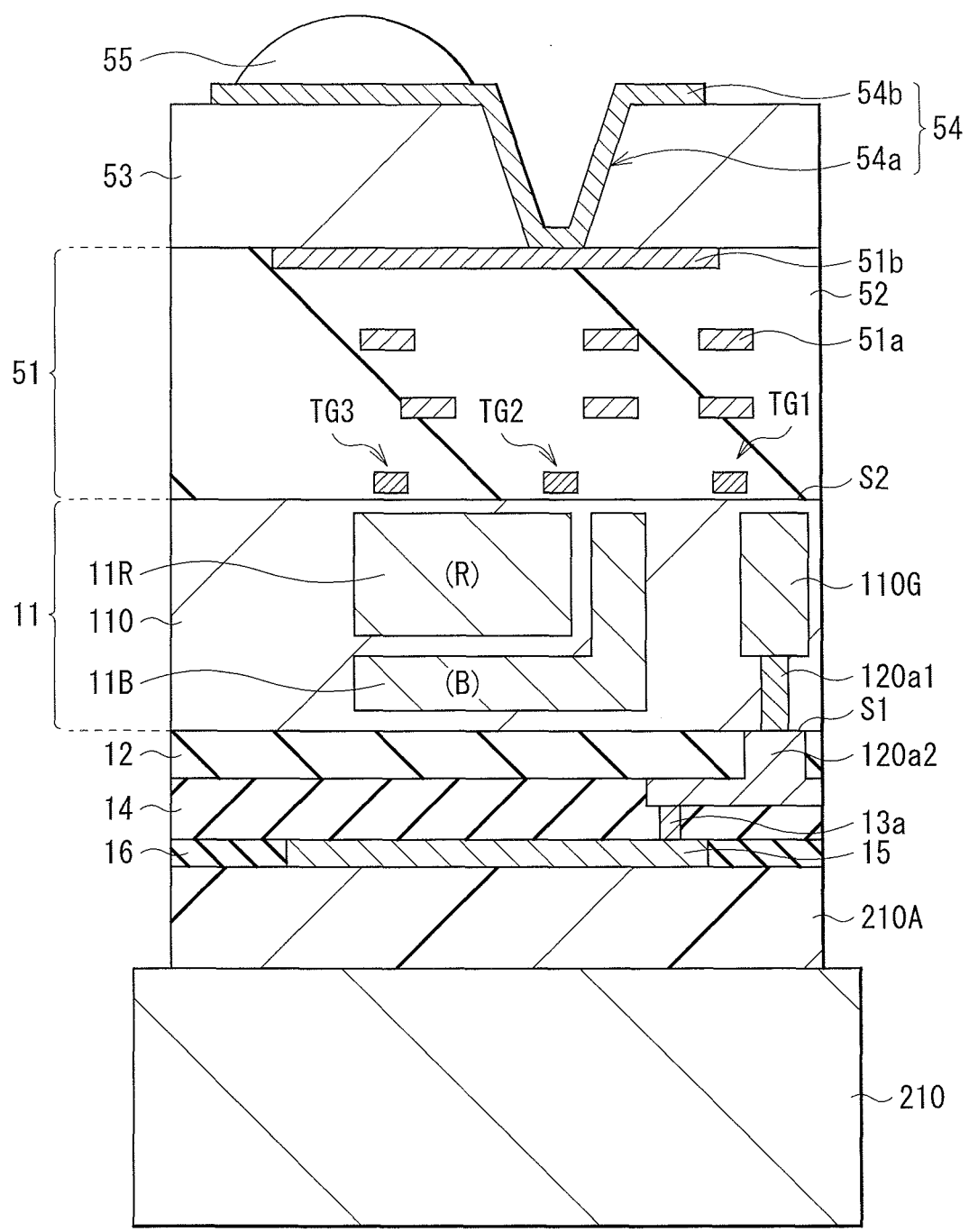
FIG. 10 is a cross-sectional view illustrating a step following the step shown in FIG. 9.

Subsequently, as shown in FIG. 10, in a state being fixed to the tentative substrate 210, the through electrode 54 and the solder bump 55 are formed on the support substrate 53 side. Specifically, first, for example, the support substrate 53 may be ground with the use of a grinder. Thereafter, the through electrode 54 configured of the through via 54a and the conductive film 54b is formed on this support substrate 53. Thereafter, the solder bump 55 is formed on the conductive film 54b of the through electrode 54. Specifically, for example, the above-described solder material may be formed into a pattern in a selective region on the conductive film 54b with the use of a mask or the like. Thereafter, for example, the solder material is heated to 200° C. or higher, and a reflow process is performed thereon. Thus, the solder bump 55 in a hemispherical shape is formed. Alternatively, the solder bump 55 may be formed by attaching a solder ball onto the conductive film 54b and heating the attached solder ball.

[Tentative Fixing 2]

Figure 11:
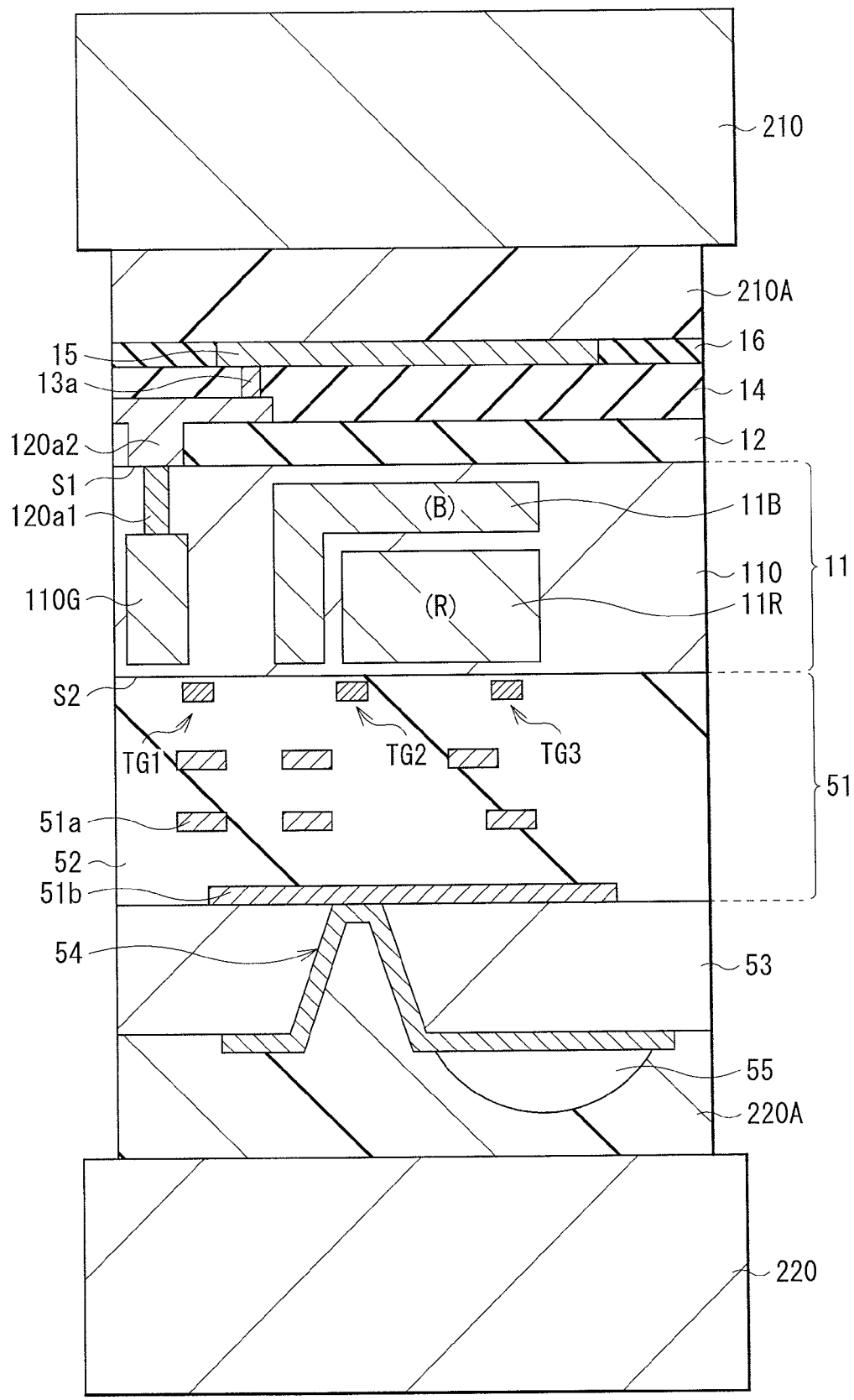
FIG. 11 is a cross-sectional view illustrating a step following the step shown in FIG. 10.

Subsequently, as shown in FIG. 11, a surface on the solder bump 55 side may be fixed (tentatively fixed), for example, on a tentative substrate 220 made of quartz with the use of an adhesive layer 220A that is allowed to be peeled off. In FIG. 11, illustration is made with the interlayer insulating film 14 on the upper side (in which the lamination structure shown in FIG. 10 is vertically inverted). As the adhesive layer 220A, for example, a material having a glass transition temperature (Tg) higher than that of the adhesive layer 210A used in the above-described step of tentative fixing 1, specifically, about 190° C. may be mentioned. It is to be noted that, in a case where the tentative substrate 220 is peeled off by a method not using the thermoplastic resin, any material in accordance with each of the methods may be used which have no limitation in glass transition temperature as described above.

Figure 12:
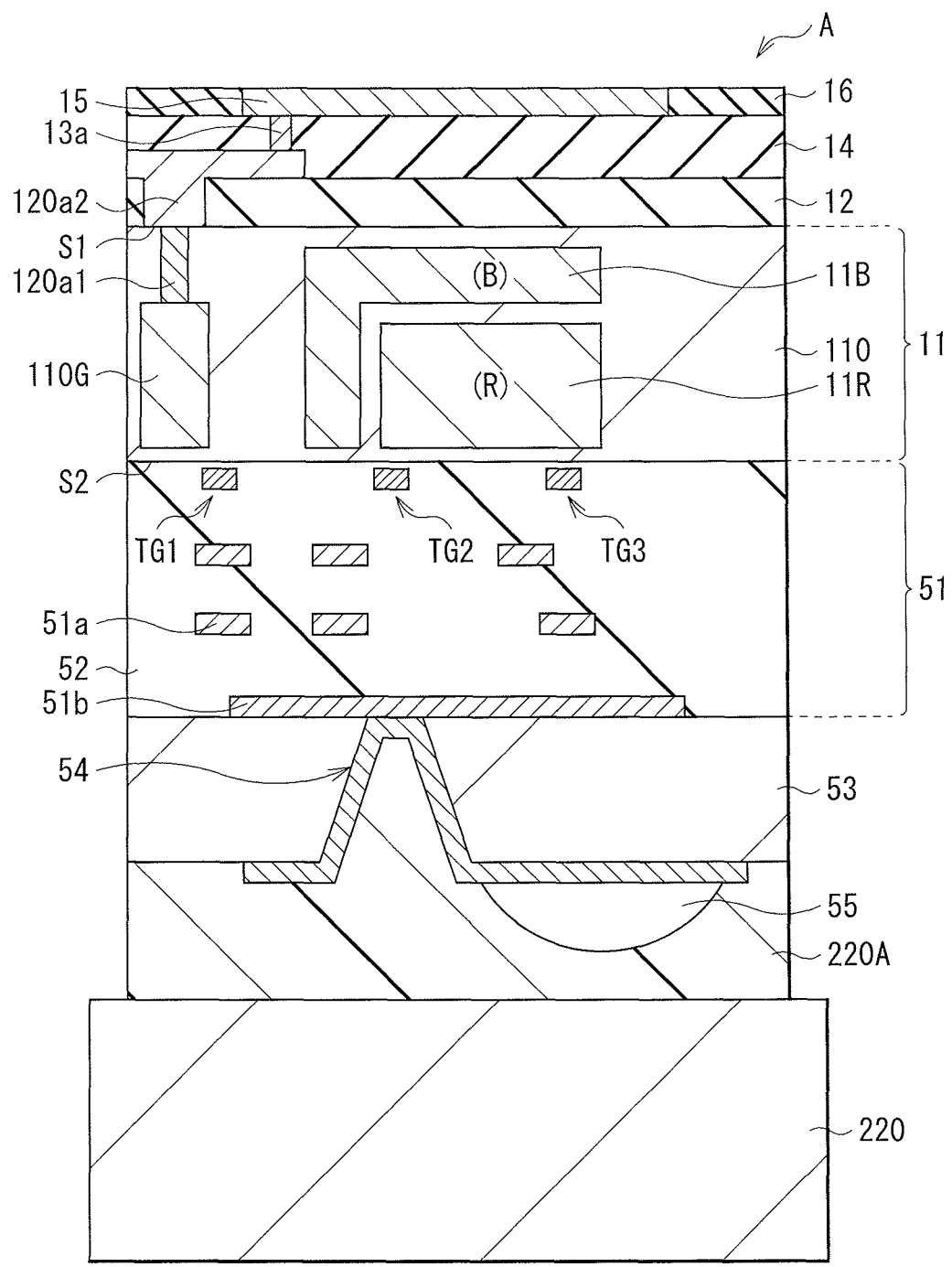
FIG. 12 is a cross-sectional view illustrating a step following the step shown in FIG. 11.

Subsequently, as shown in FIG. 12, the tentative substrate 210 and the adhesive layer 210A are peeled off from the lower electrode 15. Specifically, a temperature equal to or higher than the glass transition temperature of the adhesive layer 210A and lower than the glass transition temperature of the adhesive layer 220A (for example, equal to or higher than 150° C. and lower than 190° C.) is applied, and thereby, only the adhesive layer 210A is softened. At the same time, force anti-parallel to each other is applied between the tentative substrate 210 and the lower electrode 15 side. Thus, the tentative substrate 210 is allowed to be peeled off. Thereafter, a residual material of the adhesive layer 210A is removed by a process with the use of chemical solution, and polishing is performed, for example, by a CMP method so as to secure necessary planarization characteristics. Thus, the device substrate A having the lower electrode 15 is formed.

[2. Step of Forming Lens Component]

Figure 13A:
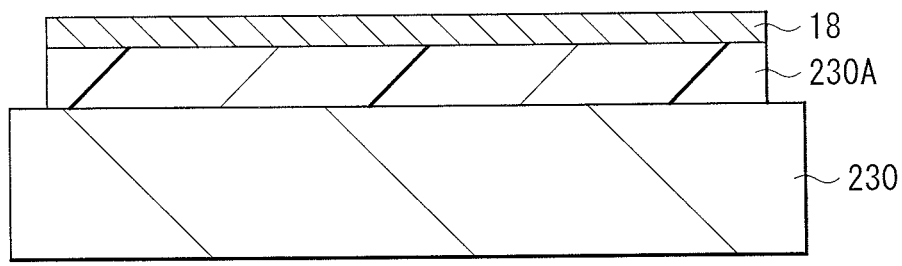
FIG. 13A is a cross-sectional view for explaining a step of forming a lens component.

On the other hand, the lens component B that includes the organic photoelectric conversion layer 17, the on-chip lens 22, and the like is formed as follows. Specifically, first, as shown in FIG. 13A, the upper electrode 18 configured of the above-described material is formed on the tentative substrate 230 with an adhesive layer 230A that is allowed to be peeled off in between. Specifically, the adhesive layer 230A is applied onto a tentative substrate 230, and is cured. Thereafter, the above-described transparent conductive film material may be deposited on this adhesive layer 230A, for example, by a sputtering method. Thereafter, the formed transparent conductive film may be patterned, for example, by etching by a photolithography method, and thereby, the upper electrode 18 is formed. As the adhesive layer 230A, for example, a material having a glass transition temperature (Tg), for example, from 130° C. to 200° C. may be used.

Figure 13B:
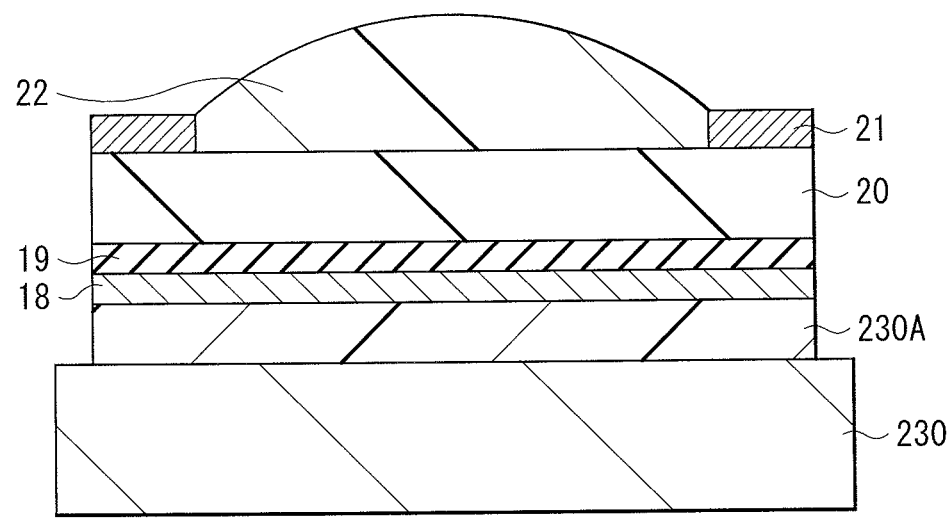
FIG. 13B is a cross-sectional view illustrating a step following the step shown in FIG. 13A.

Subsequently, as shown in FIG. 13B, the protective film 19 made of the above-described material may be formed on the upper electrode 18 by a plasma CVD method. Thereafter, the planarization layer 20 made of the above-described material may be formed, for example, by a spin coating method. Subsequently, the on-chip lens 22 and the light blocking film 21 are formed.

[Formation of on-Chip Lens 22]

At this time, first, the light blocking film 21 is formed. Specifically, the above-described metal material may be deposited, for example, by a deposition method or a sputtering method. Thereafter, the deposited metal film may be patterned into a matrix shape, for example, by etching by a photolithography method to form the light blocking film 21. Thereafter, the on-chip lens 22 is formed as follows in a region (an opening) sectioned by the light blocking film 21. Specifically, first, the above-described material (such as silicon nitride) may be deposited, for example, by a plasma CVD method, for example, for a several minutes under a temperature from 200° C. to 230° C. Subsequently, a photoresist film is applied to be formed on the formed silicon nitride film. This photoresist film is patterned by a photolithography method, and then, the patterned film is subjected to a thermosetting process to be processed into a lens shape. The processing into the lens shape is performed by a stepper exposure process. With the use of the thus-processed photoresist film as a mask, the silicon nitride film is etched. Thus, the on-chip lens 22 is allowed to be formed. As the etching method at this time, for example, a plasma dry etching method using $CF_4$ gas, $O_2$ gas, and the like may be mentioned.

[Transfer to Cover Glass 24]

Figure 14A:
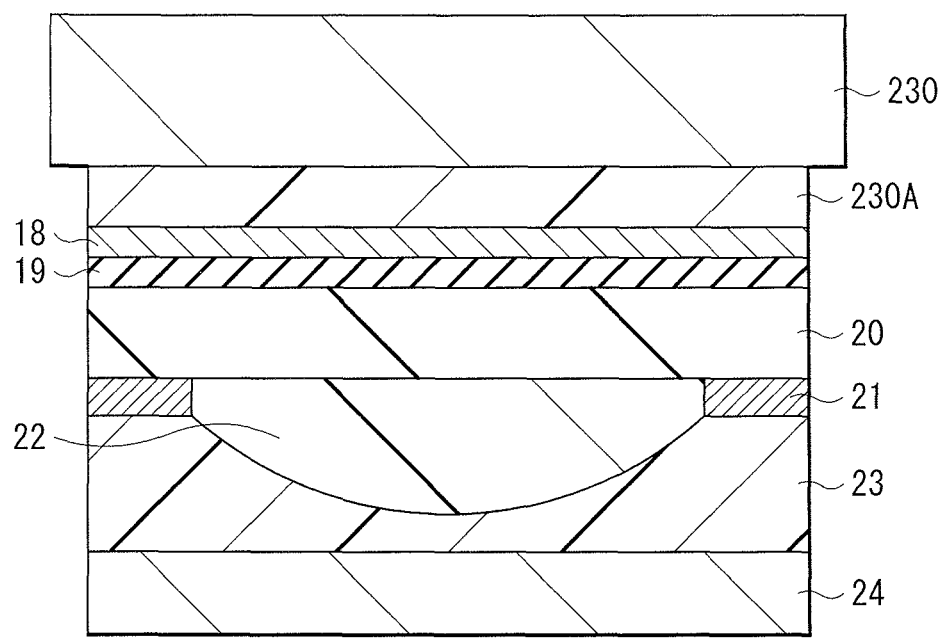
FIG. 14A is a cross-sectional view illustrating a step following the step shown in FIG. 13B.

Subsequently, as shown in FIG. 14A, the cover glass 24 having the above-described thickness (for example, 500 μm) is attached onto the formed on-chip lens 22 side with the adhesive layer 23 made of the above-described material or the like. In FIG. 14A, illustration is made with the tentative substrate 230 on the upper side (in which the lamination structure shown in FIG. 13B is vertically inverted).

Figure 14B:
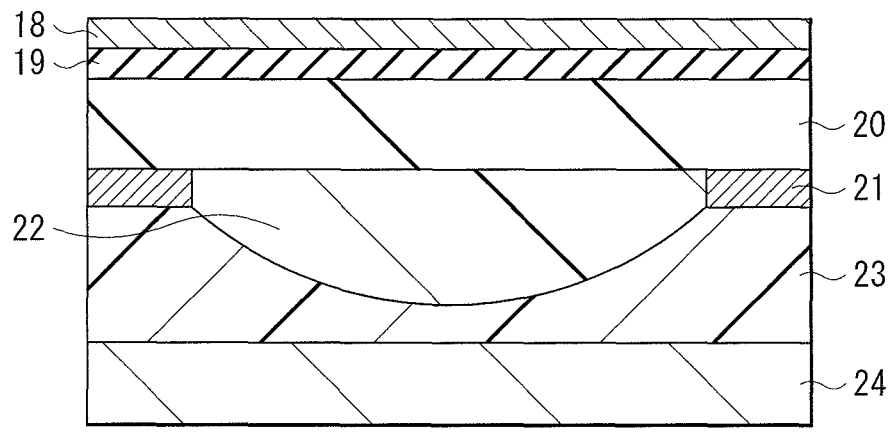
FIG. 14B is a cross-sectional view illustrating a step following the step shown in FIG. 14A.

Thereafter, as shown in FIG. 14B, the tentative substrate 230 and the adhesive layer 230A are peeled off from the upper electrode 18. Specifically, the adhesive layer 230A is softened by applying a temperature equal to or higher than the glass transition temperature of the adhesive layer 230A, and the tentative substrate 230 is peeled off by applying force antiparallel to each other between the tentative substrate 230 and the upper electrode 18. Thus, with the use of the tentative substrate 230, it is possible to attach the cover glass 24 onto the on-chip lens 22 without forming a cavity. Subsequently, the residual material of the adhesive layer 230A is removed by a process with the use of chemical solution to allow the upper electrode 18 to be exposed. Also, the upper electrode 18 may be polished, for example, by a CMP method as necessary.

[Formation of Organic Photoelectric Conversion Layer 17]

Figure 15:
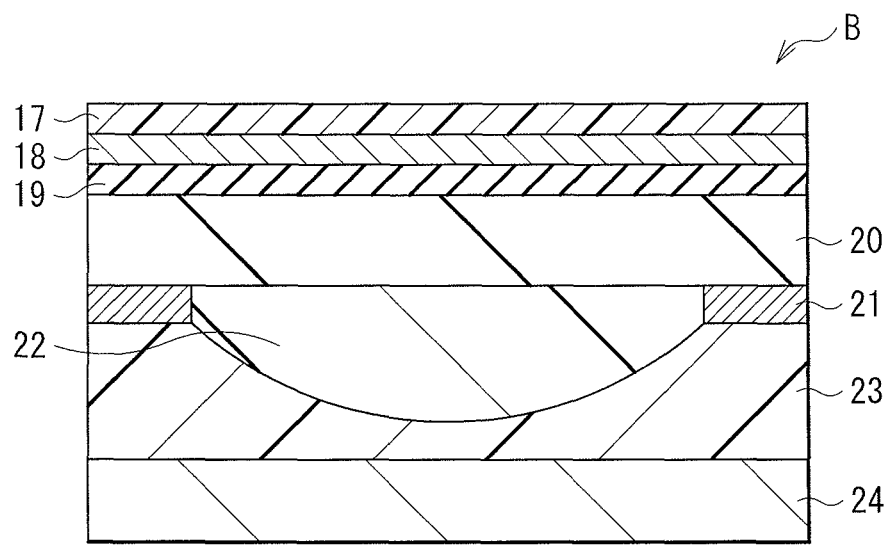
FIG. 15 is a cross-sectional view illustrating a step following the step shown in FIG. 14B.
Figure 16:
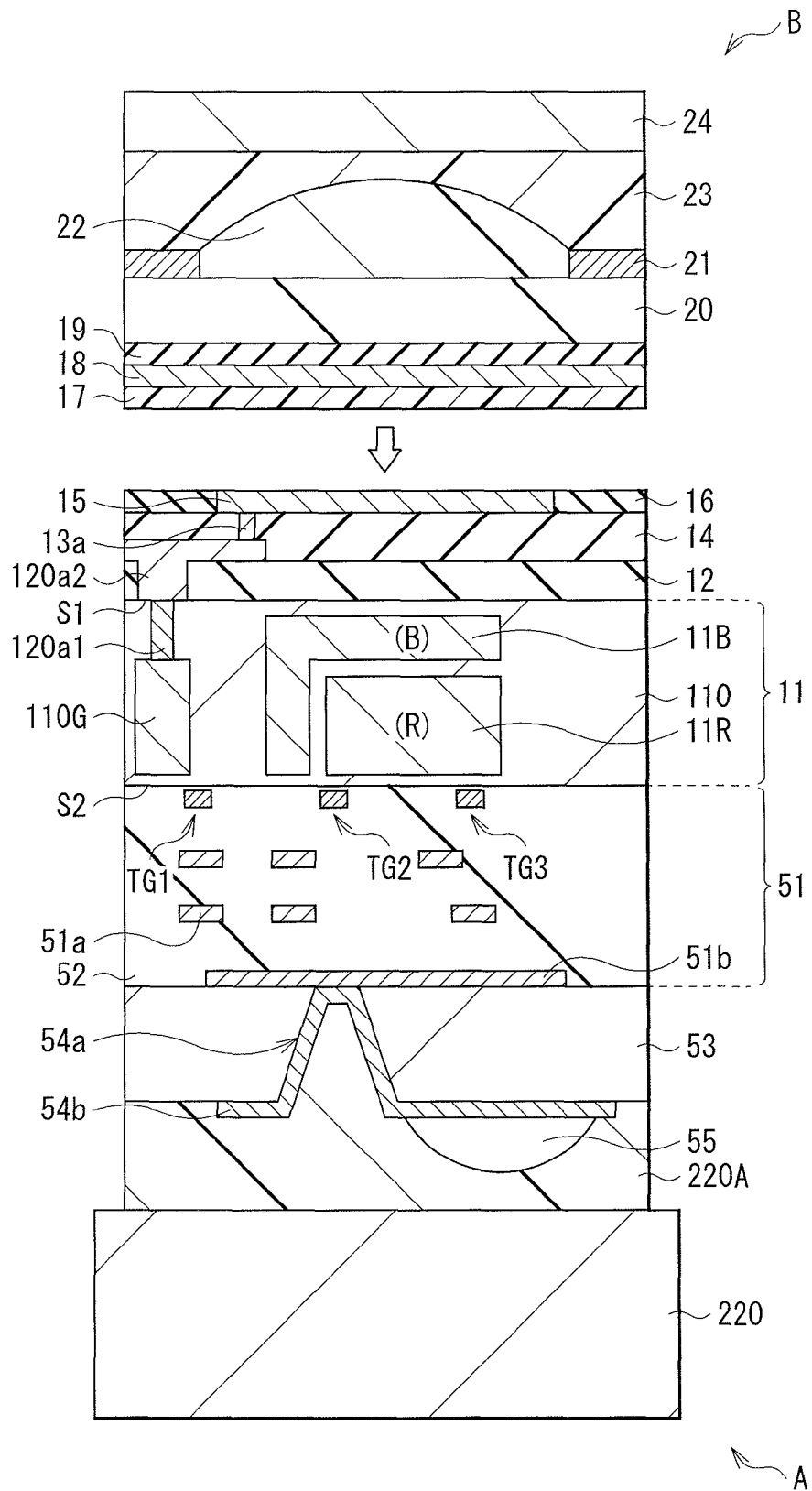
FIG. 16 is a cross-sectional view for explaining an attaching step.

Subsequently, as shown in FIG. 15, the organic photoelectric conversion layer 17 made of the above-described material or the like may be formed on the upper electrode 18, for example, by a vacuum deposition method or the like. Thereafter, the surface of the organic photoelectric conversion layer 17 may be polished (planarized), for example, by a CMP method so as to secure planarization characteristics necessary for attaching. Thus, the lens component B having the organic photoelectric conversion layer 17 is formed. In such a manner, although the details will be described later, in the present embodiment, the upper electrode 18 is formed before forming the organic photoelectric conversion layer 17 at the time of fabricating the lens component B. Therefore, the organic photoelectric conversion layer 17 is less likely to be damaged by the patterning of the upper electrode 18. In addition thereto, it is possible to form the on-chip lens 22 and the light blocking film 21 accompanying, for example, a process performed at a high temperature of 200° C. or higher before forming the organic photoelectric conversion layer 17.

[3. Attaching Step]

Next, as shown in FIG. 16, the device substrate A and the lens component B that have been fabricated as described above are attached to each other. At this time, the device substrate A is attached to the lens component B so as to allow the lower electrode 15 formed in the device substrate A to be electrically connected to the organic photoelectric conversion layer 17 formed in the lens component B. Specifically, in the present embodiment, for example, a beam of an element (or an element ion) of argon (Ar) or the like is applied in ultrahigh vacuum to each of the surfaces (the opposing surfaces) of the lower electrode 15 and the organic photoelectric conversion layer 17, or plasma irradiation with the use of the above-described element may be performed thereon. Subsequently, the lower electrode 15 and the organic photoelectric conversion layer 17 are arranged to oppose each other, and the device substrate A is allowed to be in contact with (or pressure-bonded to) the lens component B. Dangling bond is caused (activated) on each of the surfaces of the lower electrode 15 and the organic photoelectric conversion layer 17 by beam irradiation. It is possible to perform adhesion while securing electric connection by utilizing these dangling bonds.

It is to be noted that, in the electric connection between the lower electrode 15 and the organic photoelectric conversion layer 17, contact resistance thereof may be desirably equivalent to or lower than the contact resistance in the case where the organic photoelectric conversion layer 17 is directly formed on the lower electrode 15, but may have any resistance value that is not a problem in terms of the characteristics of the device. Such a resistance value is adjustable in accordance with the attaching method, the planarization characteristics of the opposing surfaces of the lower electrode 15 and the organic photoelectric conversion layer 17, etc.

Lastly, the tentative substrate 220 is peeled off. Specifically, by applying a temperature (for example, 190° C.) equal to or higher than the glass transition temperature of the adhesive layer 220A, the adhesive layer 220A is softened, and thereby, the tentative substrate 220 is peeled off. Subsequently, the residual material of the adhesive layer 220A is removed by a process with the use of chemical solution, and thereby, the solder bump 55 is exposed. Alternatively, it is also possible to remove the adhesive layer 220A by a process with the use of chemical solution, a plasma dry etching, or the like after removing the tentative substrate 220 by a mechanical processing process such as a polishing process. Thus, the photoelectric conversion device 10 shown in FIG. 1 is completed.

[Functions and Effects]

In the photoelectric conversion device 10 of the present embodiment, for example, as a pixel of the solid-state imaging unit, a signal charge is acquired as follows. Specifically, when light enters the photoelectric conversion device 10 through the on-chip lens 22, the incident light passes through the organic photoelectric conversion section 11G and the inorganic photoelectric conversion sections 11B and 11R in order, and is subjected to photoelectric conversion for the respective colors of red, green, and blue in the passing process.

Specifically, first, green light is selectively detected (absorbed) in the organic photoelectric conversion section 11G, and is subjected to photoelectric conversion. Accordingly, for example, an electron out of a generated pair of an electron and a hole is extracted from the lower electrode 15 side, and then, is accumulated in the green electric storage layer 110G via the wiring layer 13a and the conductive plugs 120a1 and 120a2. It is to be noted that a hole is discharged from the upper electrode 18 side via an unillustrated wiring layer. Subsequently, out of the light that has passed through the organic photoelectric conversion section 11G, blue light and red light are absorbed and subjected to photoelectric conversion in order in the inorganic photoelectric conversion sections 11B and 11R, respectively. An electron corresponding to the blue light is accumulated in an n-type region (the n-type photoelectric conversion layer 111n) in the inorganic photoelectric conversion section 11B. Similarly, an electron corresponding to the red light is accumulated in an n-type region (the n-type photoelectric conversion layer 112n) in the inorganic photoelectric conversion section 11R.

At the time of performing a reading operation, the transfer transistors Tr1, Tr2, and Tr3 are turned on, and the electrons accumulated in the green electric storage layer 110G, and the n-type photoelectric conversion layers 111n and 112n are transferred to the FD 113, 114, and 116, respectively. Accordingly, the light receiving signal of each color is read to the vertical signal line Lsig described later via other unillustrated transistor. By thus vertically laminating the organic photoelectric conversion section 11G and the inorganic photoelectric conversion sections 11B and 11R, it is possible to separately detect color light of red, green, and blue, to obtain a signal charge of each color without providing a color filter.

Here, the photoelectric conversion device 10 as described above has a configuration in which the organic photoelectric conversion layer 17 is sandwiched by the lower electrode and the upper electrode 18 both made of inorganic materials in the organic photoelectric conversion section 11G. Further, the on-chip lens 22 is formed above the organic photoelectric conversion section 11G, and the solder bump 55 for external connection is formed below the support substrate 53. Therefore, there is the following concern in the manufacturing process. FIGS. 17 to 20 illustrate a method of manufacturing a photoelectric conversion device according to a comparative example of the present embodiment. The photoelectric conversion device of the comparative example has a lamination structure including an organic photoelectric conversion section and an inorganic photoelectric conversion section as in the above-described embodiment. In the method of manufacturing the photoelectric conversion device of this comparative example, the process of forming the multi-layered wiring layer 51 and the support substrate 53 on the surface S2 side of the semiconductor substrate 11 in which the inorganic photoelectric conversion sections 11B and 11R are embedded, and the process of then forming the lower electrode 15 thereon with the interlayer insulating films 12 and 14 in between are similar to those in the present embodiment.

Figure 17:
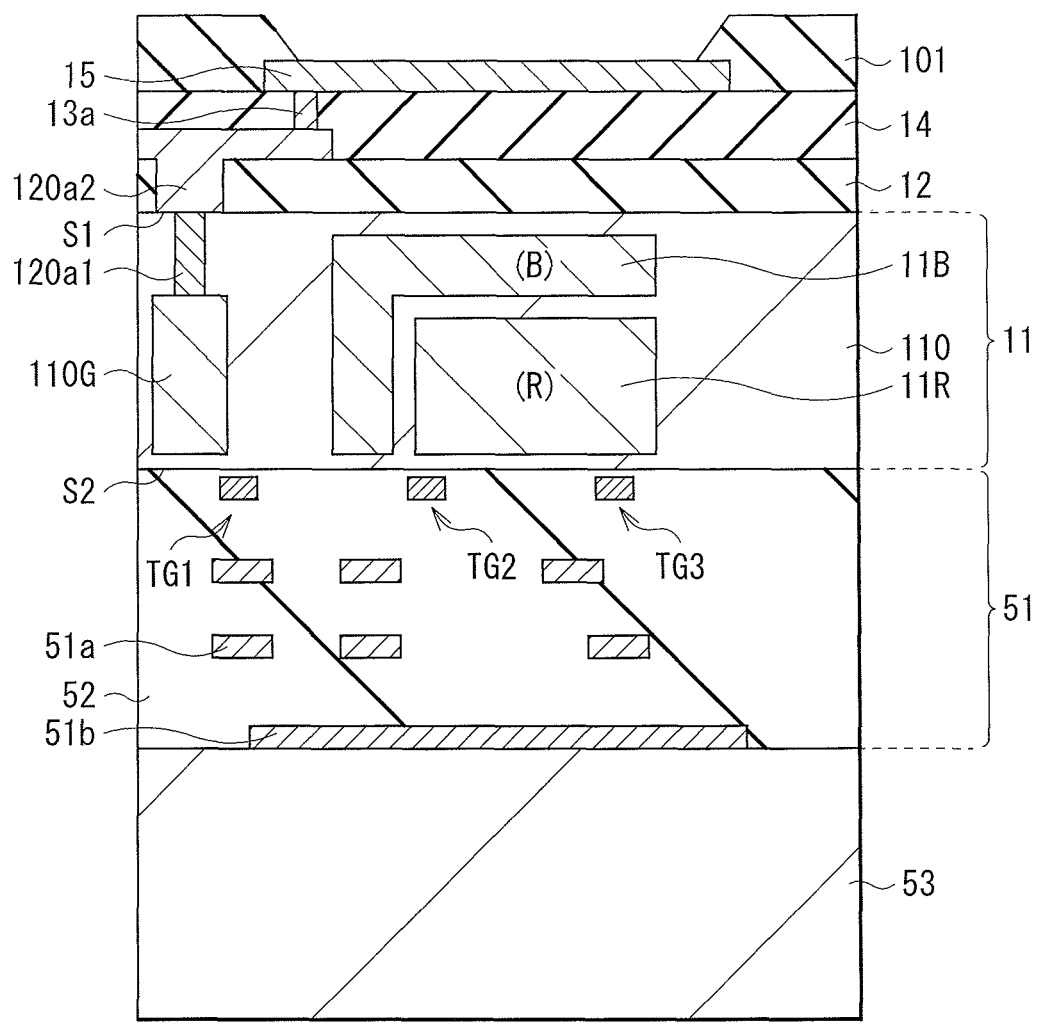
FIG. 17 is a cross-sectional view for explaining a method of manufacturing a photoelectric conversion device according to a comparative example.
Figure 18:
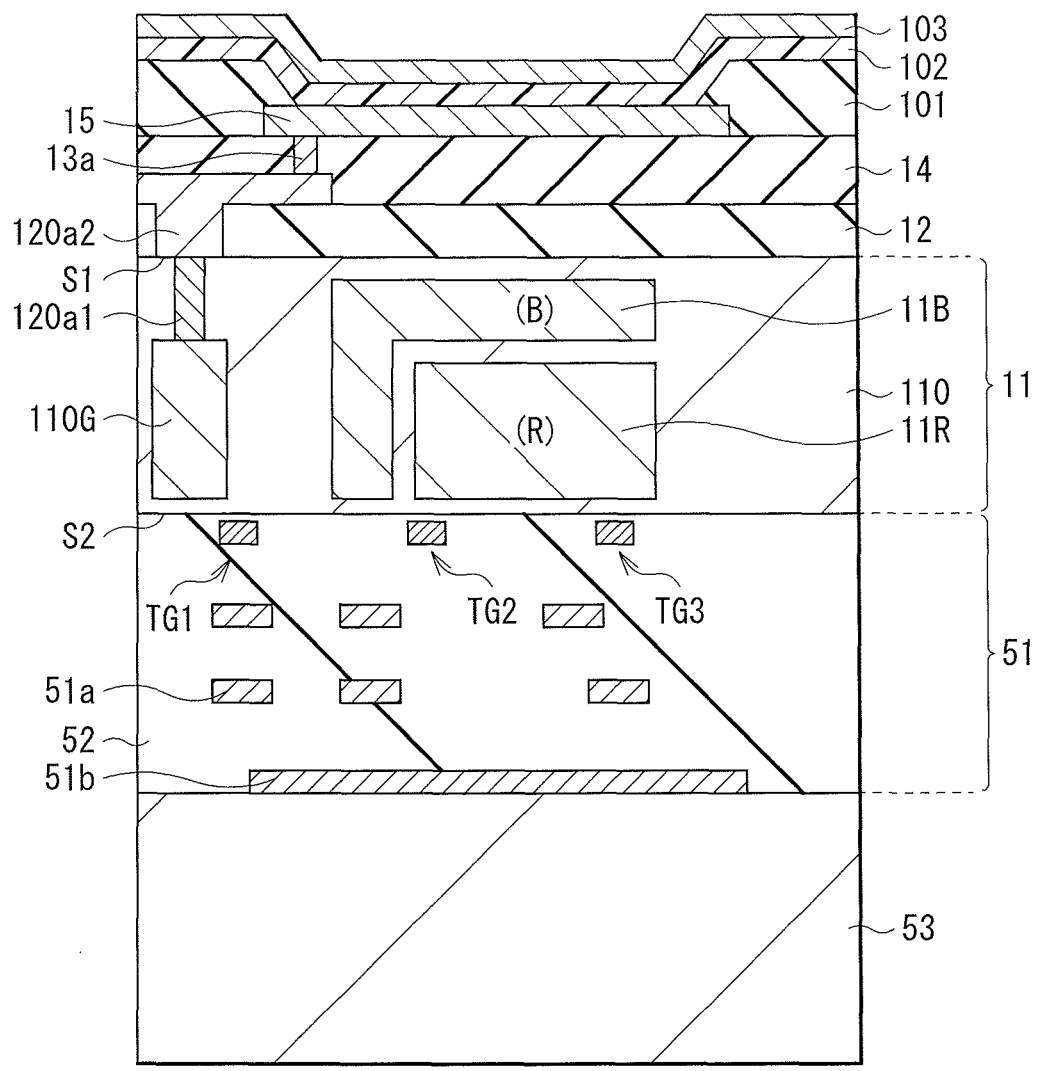
FIG. 18 is a cross-sectional view illustrating a step following a step shown in FIG. 17.
Figure 19:
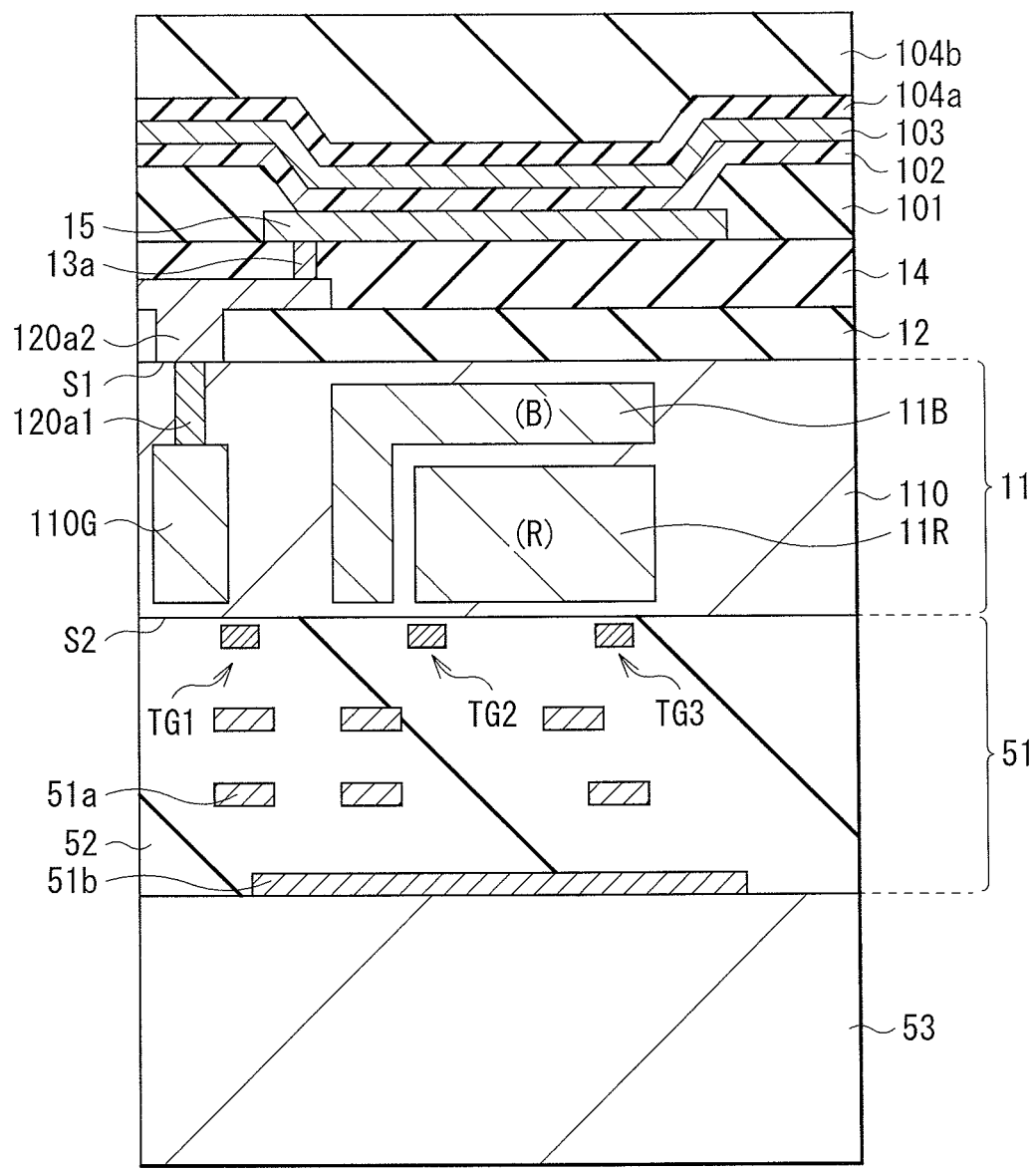
FIG. 19 is a cross-sectional view illustrating a step following the step shown in FIG. 18.

However, in the comparative example, after forming the lower electrode 15, an insulating film 101 that has an opening opposing the lower electrode 15 is formed as shown in FIG. 17. Thereafter, as shown in FIG. 18, an organic photoelectric conversion layer 102 is formed thereon, and an upper electrode 103 made of an inorganic material such as ITO is formed in a pattern on this organic photoelectric conversion layer 102. At the time of patterning the upper electrode 103, etching is performed by a photolithography method. Therefore, the organic photoelectric conversion layer 102 may be damaged by the washing solution after removing the photoresist, etc. Subsequently, as shown in FIG. 19, a protective film 104a and a planarization layer 104b are formed on this upper electrode 103.

Figure 20:
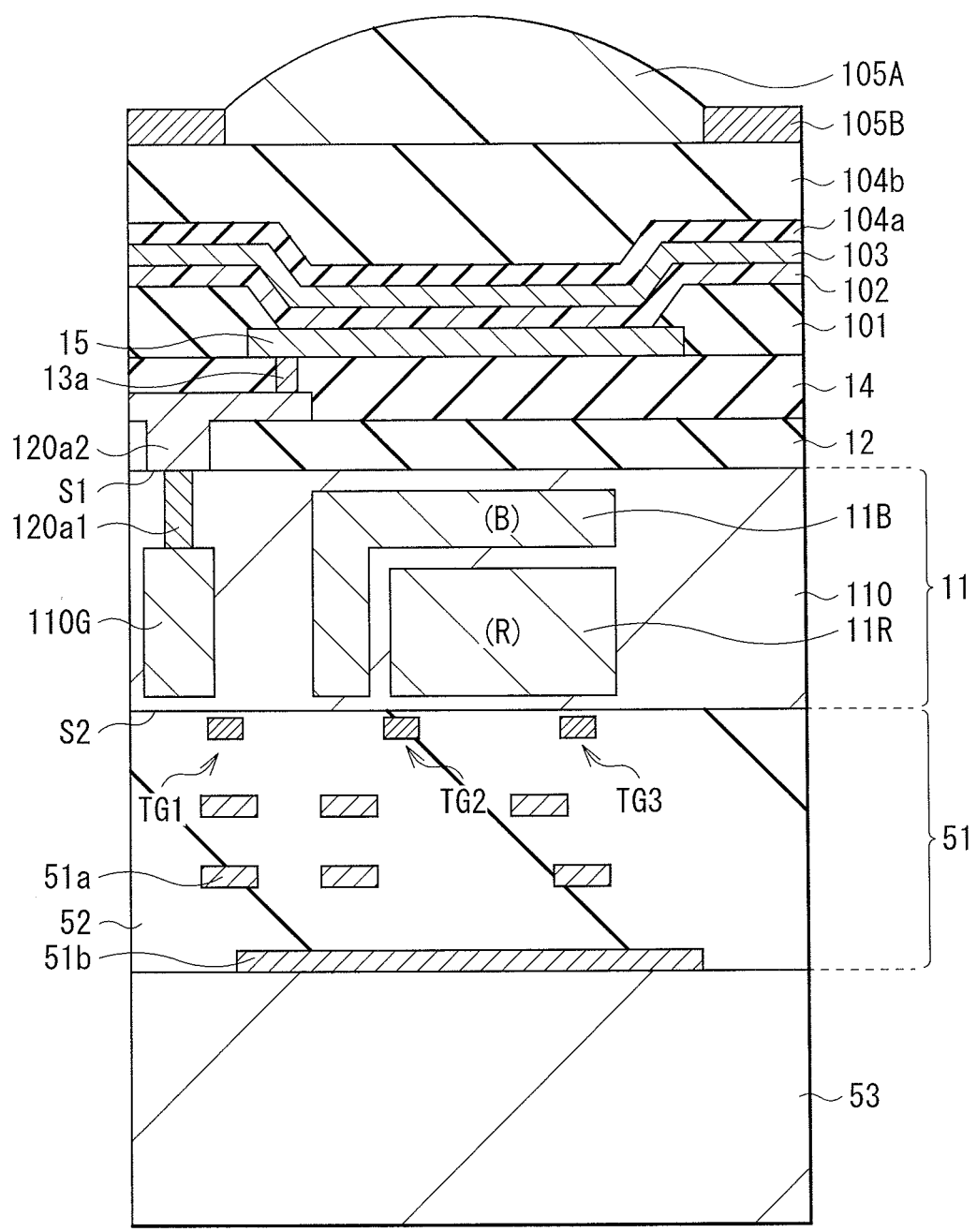
FIG. 20 is a cross-sectional view illustrating a step following the step shown in FIG. 19.
Figure 21:
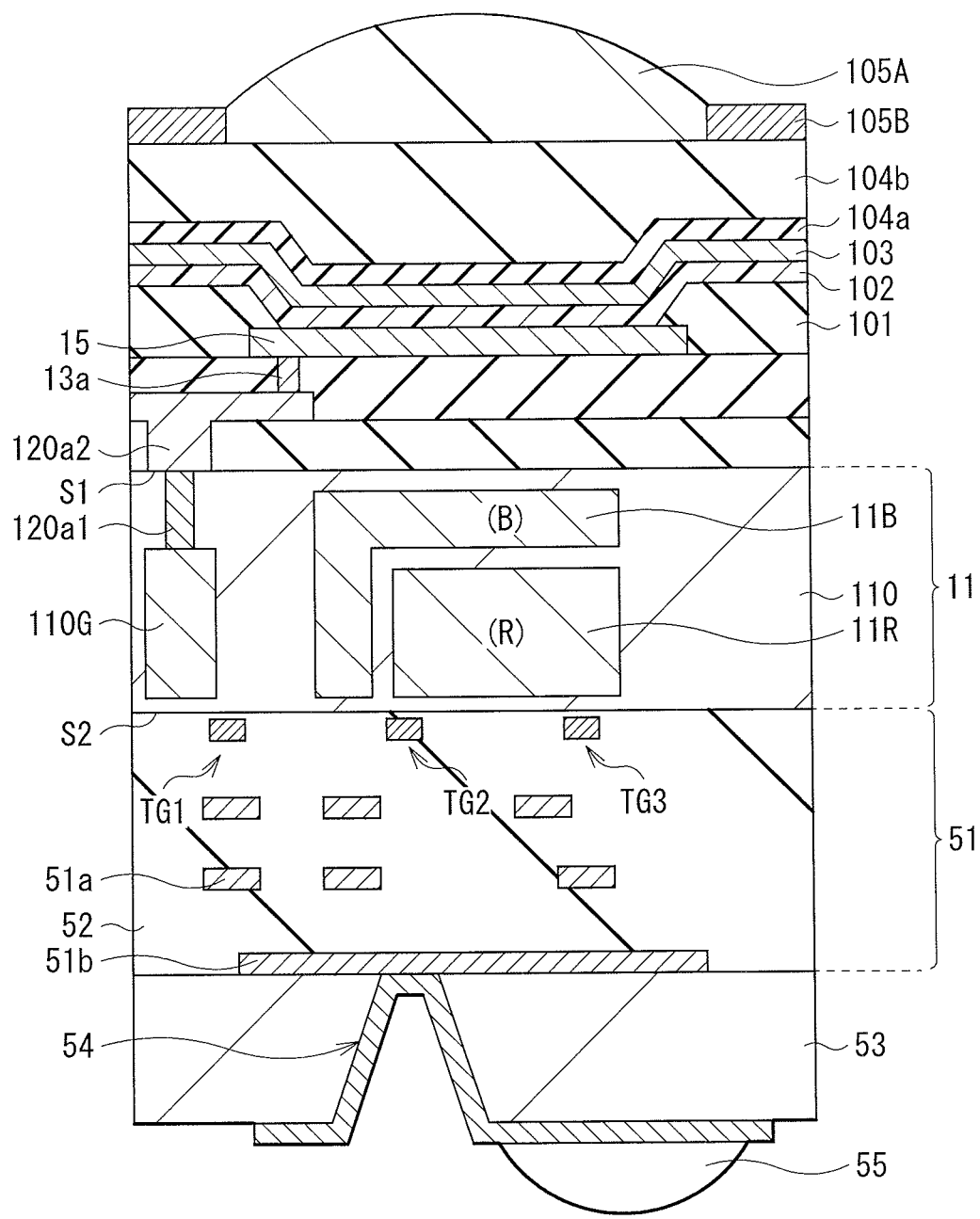
FIG. 21 is a cross-sectional view illustrating a step following the step shown in FIG. 20.

Moreover, subsequently, as shown in FIG. 20, an on-chip lens 105A and a light blocking film 105B are formed on the planarization layer 104b. At this time, the process at a high temperature of 200° C. or higher is performed as described above. Therefore, the organic photoelectric conversion layer 102 with poor thermal tolerance may be degraded. Further, subsequently, as shown in FIG. 21, it is necessary to form the through electrode 54 and the solder bump 55 on the support substrate 53. However, the process at a high temperature for solder reflow is performed as described above also at this time. Therefore, the organic photoelectric conversion layer 102 may be degraded similarly to the above description. However, a specific process method taking into consideration the thermal tolerance of the organic photoelectric conversion material has not yet established, and its achievement is desired.

Therefore, in the present embodiment, as described above, the organic photoelectric conversion layer 17 is formed on the lower electrode 15 after the lower electrode 15 is formed on the surface S1 side of the semiconductor substrate 11 and the solder bump 55 is formed on the surface S2 side thereof (after the device substrate A is formed) in the manufacturing process. In other words, the solder bump 55 is formed before the step of forming the organic photoelectric conversion layer 17, and therefore, a temperature equal to or higher than the tolerable temperature of the organic photoelectric conversion layer 17, for example, a high temperature at the time of solder reflow is less likely to be applied to the organic photoelectric conversion layer 17.

Moreover, the organic photoelectric conversion layer 17 is formed (laminated) on the lower electrode 15 by forming the organic photoelectric conversion layer 17 on another member (the lens component B including the on-chip lens 22), and then by attaching the lens component B onto the lower electrode 15. In other words, the upper electrode 18 is formed before forming the organic photoelectric conversion layer 17 in the lens component B, and therefore, patterning of the inorganic material on the organic photoelectric conversion layer 17 becomes unnecessary. In addition thereto, since the on-chip lens 22 and the light blocking film 21 are formed before forming the organic photoelectric conversion layer 17, the organic photoelectric conversion layer 17 is less likely to be exposed to the high temperature process accompanying the process of forming the on-chip lens 22 and the light blocking film 21.

As described above, in the present embodiment, the organic photoelectric conversion layer 17 and the upper electrode 18 are formed on the lower electrode 15 after the lower electrode 15 is formed on the surface S1 side of the semiconductor substrate 11 and the solder bump 55 is formed on the surface S2 side thereof in the manufacturing process. Therefore, it is possible to suppress exposure of the organic photoelectric conversion layer 17 to a high temperature environment. Accordingly, it is possible to suppress degradation in the organic photoelectric conversion layer.

Next, description will be provided of modifications (Modifications 1 to 3) of the photoelectric conversion device or the method of manufacturing the photoelectric conversion device in the above-described embodiment. The components similar to those in the above-described embodiment are attached with similar symbols and the description thereof will be appropriately omitted below.

[Modification 1]

Figure 22:
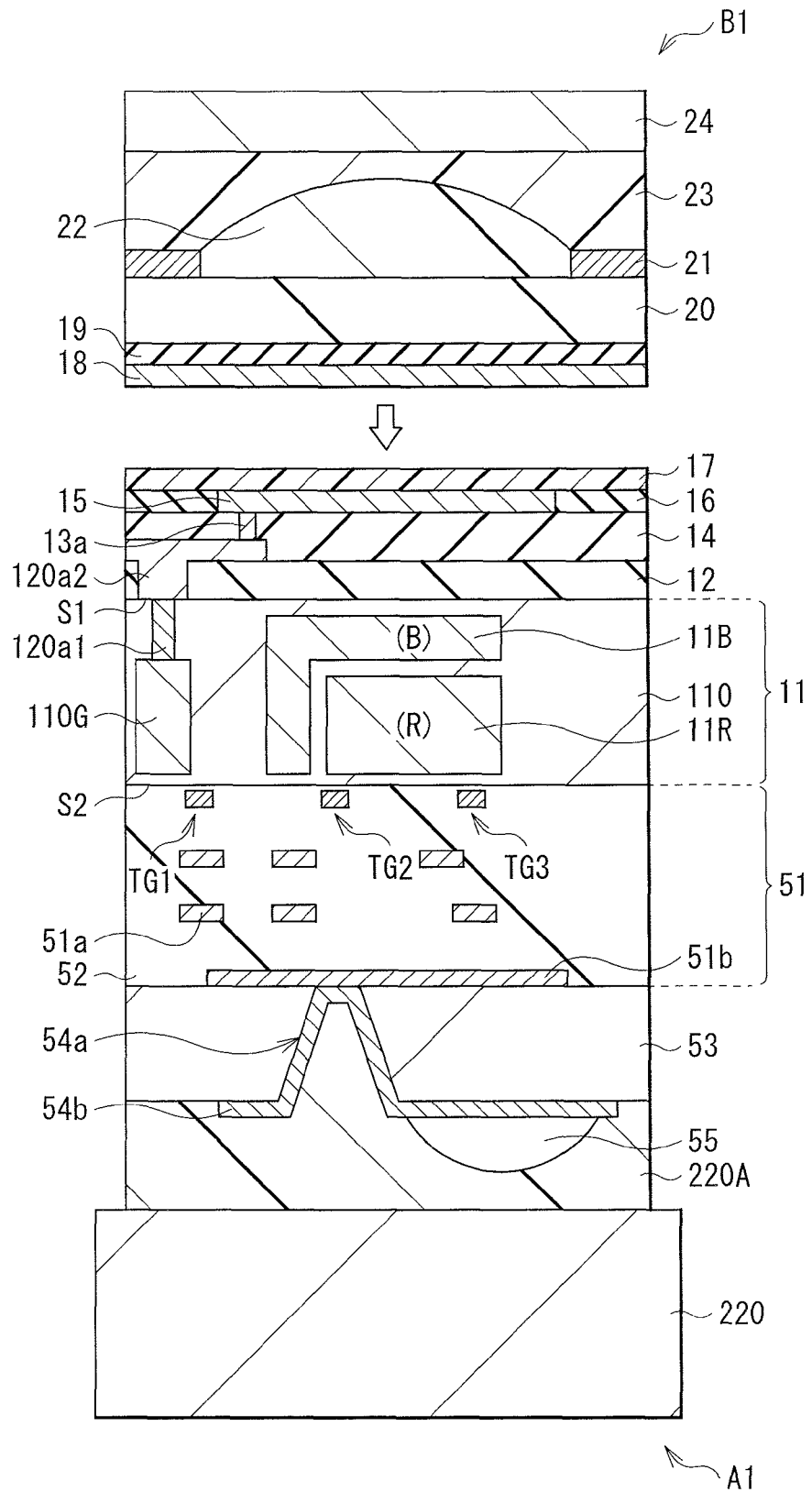
FIG. 22 is a cross-sectional view for explaining a method of manufacturing a photoelectric conversion device according to Modification 1.

FIG. 22 is a cross-sectional view for explaining a method of manufacturing a photoelectric conversion device according to Modification 1. In the above-described embodiment, a component in which the lower electrode 15 out of the organic photoelectric conversion section 11G is formed on the surface S1 side of the semiconductor substrate 11 is used as the device substrate A, and a component in which the upper electrode 18 and the organic photoelectric conversion layer 17 are laminated on one surface side of the on-chip lens 22 is used as the lens component B in the manufacturing process. Specifically, the organic photoelectric conversion layer 17 is formed in advance on the lens component B side and the organic photoelectric conversion section 11G is formed by attaching this to the device substrate A. However, the organic photoelectric conversion layer 17 may be formed not only on the lens component but on the device substrate side as in the present modification.

Specifically, in a device substrate (a device substrate A1) of the present modification, the support substrate 53 having the solder bump 55 is attached onto the surface S2 side of the semiconductor substrate 11 with the multi-layered wiring layer 51 in between, and the lower electrode 15, the insulating film 16, and the organic photoelectric conversion layer 17 are formed on the surface S1 side with the interlayer insulating films 12 and 14 in between. On the other hand, in a lens component (a lens component B1), the adhesive layer 23, the on-chip lens 22, the light blocking film 21, the planarization layer 20, the protective layer 19, and the upper electrode 18 are laminated on one surface side of the cover glass 24.

At the time of fabricating the device substrate A1, in a manner similar to that in the above-described embodiment, the support substrate 53 is attached onto the surface S2 side of the semiconductor substrate 11 with the multi-layered wiring layer 51 in between, and then, the interlayer insulating films 12 and 14 are formed on the surface S1 (FIGS. 4 and 5). Moreover, after the lower electrode 15 and the insulating film 16 are formed on this interlayer insulating film 14, the lower electrode 15 side is tentatively fixed, and the through electrode 54 and the solder bump 55 are formed on the support substrate 53 side (FIGS. 6 to 10). Subsequently, the solder bump 55 side is fixed tentatively, and the tentative fixation of the lower electrode 15 side is resolved to allow the lower electrode 15 to be exposed (FIGS. 11 and 12). In the present modification, the organic photoelectric conversion layer 17 may be formed on the lower electrode 15, for example, by a vacuum deposition method or the like after this. At this time, the surface of the organic photoelectric conversion layer 17 may be polished, for example, by a CMP method to an extent that secures planarization characteristics necessary for attaching.

At the time of fabricating the lens component B1, in a manner similar to that in the above-described embodiment, the protective layer 19 and the planarization layer 20 are formed on the upper electrode 18, and then, the on-chip lens 22 and the light blocking film 21 are formed (FIGS. 13A and 13B). Subsequently, the cover glass 24 is attached on the on-chip lens 22 side with the use of the adhesive layer 23, and then, the tentative fixation is resolved to allow the upper electrode 18 to be exposed (FIGS. 14A and 14B). Subsequently, the surface of the upper electrode 18 may be polished, for example, by a CMP method to an extent that secures planarization characteristics necessary for attaching.

By attaching the device substrate A1 and the lens component B1 fabricated as described above to each other in a manner similar to that in the above-described embodiment, the photoelectric conversion device 10 having the lamination structure shown in FIG. 1 is allowed to be formed.

[Modification 2]

Figure 23:
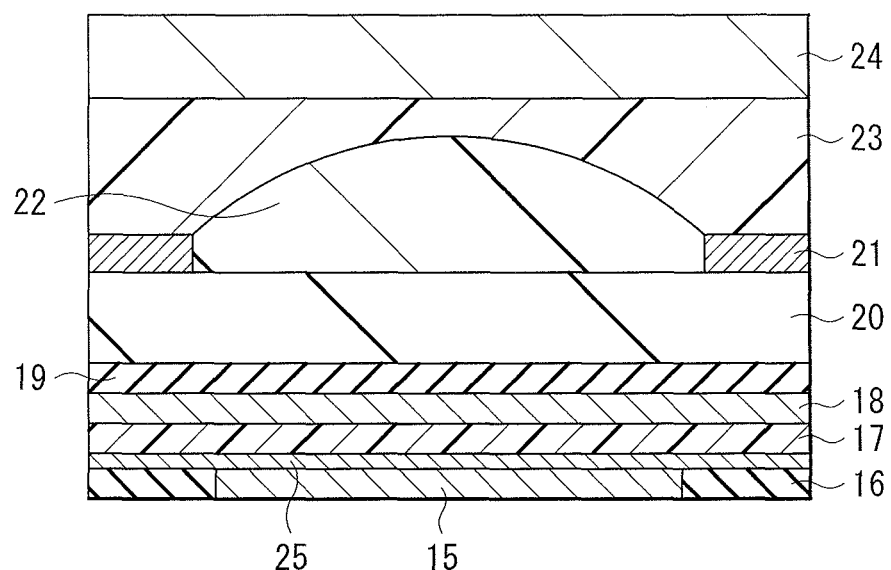
FIG. 23 is a cross-sectional view illustrating a configuration of main part of a photoelectric conversion device according to Modification 2.

FIG. 23 illustrates a configuration of main part of a photoelectric conversion device according to Modification 2. The photoelectric conversion device of the present modification has the organic photoelectric conversion section 11G on the surface S1 side of the semiconductor substrate 11, and has the inorganic photoelectric conversion sections 11B and 11R formed to be embedded in the semiconductor substrate 11 as with the above-described embodiment. Moreover, the support substrate 53 is provided on the surface S2 side of the semiconductor substrate 11 with the multi-layered wiring layer 51 in between, and the solder bump 55 is formed on the support substrate 53. In FIG. 23, illustration of the layer structure of the interlayer insulating film 14 and the layers therebelow is omitted for the sake of simplification.

However, in the present modification, a conductive adhesive layer 25 is formed between the organic photoelectric conversion layer 17 and the lower electrode 15. As described above, the manufacturing process includes a step of attaching the organic photoelectric conversion layer 17 onto the lower electrode 15 as described above. However, in the present modification, the attaching (adhesion) of these components is performed with the use of the conductive adhesive layer 25. As the conductive adhesive layer 25, for example, an anisotropic conductive adhesive material such as ACP (Anisotropic Conductive Paste) or ACF (Anisotropic Conductive Film) may be used. It is to be noted that the attaching method with the use of this conductive adhesive layer 25 is applicable also to a case where the attaching is performed between the organic photoelectric conversion layer 17 and the upper electrode 18 as in Modification 1 described above.

[Modification 3]

Figure 24:
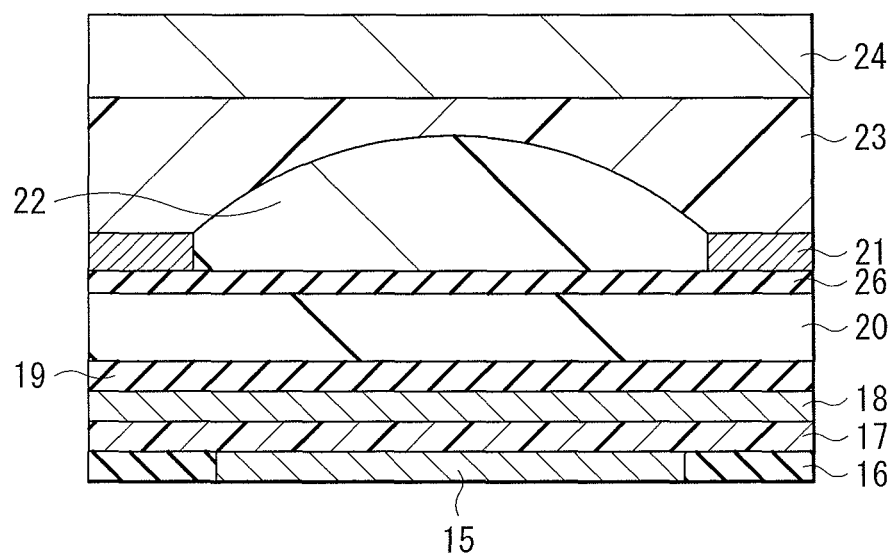
FIG. 24 is a cross-sectional view illustrating a configuration of main part of a photoelectric conversion device according to Modification 3.

FIG. 24 illustrates a configuration of main part of a photoelectric conversion device according to Modification 3. As with the above-described embodiment, the photoelectric conversion device of the present modification includes the organic photoelectric conversion section 11G on the surface S1 side of the semiconductor substrate 11, and includes the inorganic photoelectric conversion sections 11B and 11R formed to be embedded in the semiconductor substrate 11. Further, the support substrate 53 is provided on the surface S2 side of the semiconductor substrate 11 with the multi-layered wiring layer 51 in between, and the solder bump 55 is formed on the support substrate 53. FIG. 24 omits illustration of the layer structure of the interlayer insulating film 14 and the layers therebelow for the sake of simplification.

However, in the present modification, a stress moderating layer 26 is provided between the planarization layer 20 and the on-chip lens 22.

The stress moderating layer 26 moderates a difference in film stress between the planarization layer 20 made of the above-described organic material and the on-chip lens 22 made of, for example, an inorganic material. The stress moderating layer 26 has film stress that is at the middle of those of the planarization layer 20 and the on-chip lens 22. The organic material layer and the inorganic material layer largely differ from each other in film stress. Therefore, when the organic material layer and the inorganic material layer are laminated in direct contact, deformation may be caused in an interface thereof by the difference in film stress. As in the present modification, by interposing such a stress moderating layer 26 between the on-chip lens 22 and the planarization layer 20, it is possible to suppress deformation in shape of a film in the interface of the lamination. Accordingly, it is possible to avoid degradation in light condensing characteristics of the on-chip lens 22.

A material of such a stress moderating layer 26 may desirably be, for example, an inorganic material that has a refractive index from 1.4 to 2.0, and may be desirably formed by a low-temperature plasma CVD method. Specifically, silicon compounds expressed by composition formulas SiO, SiN, or $SiO_XN_Y$ (where $0<X\le1$ and $0<Y\le1$, hereinafter described as SiON) may be mentioned. For example, in a case where SiN (having a refractive index from 1.8 to 2.0) is used for the on-chip lens 22 and an acrylic-based resin (having a refractive index from 1.4 to 1.5) is used for the planarization layer 20, when SiON (having a refractive index from 1.6 to 1.9) is used for the stress moderating layer 26, it is possible to reduce reflection at the interface of the lamination in addition to the effect of moderating the film stress as described above. As a result, light condensing characteristics of the solid-state imaging device are improved. Moreover, the stress moderating layer 22 (SiON) and the on-chip lens 22 (SiN) are allowed to be formed in the same CVD process. It is to be noted that such a stress moderating layer 22 may be a single-layer film made of the above-described material, or may be a laminated film made of two or more thereof.

Application Example 1

Figure 25:
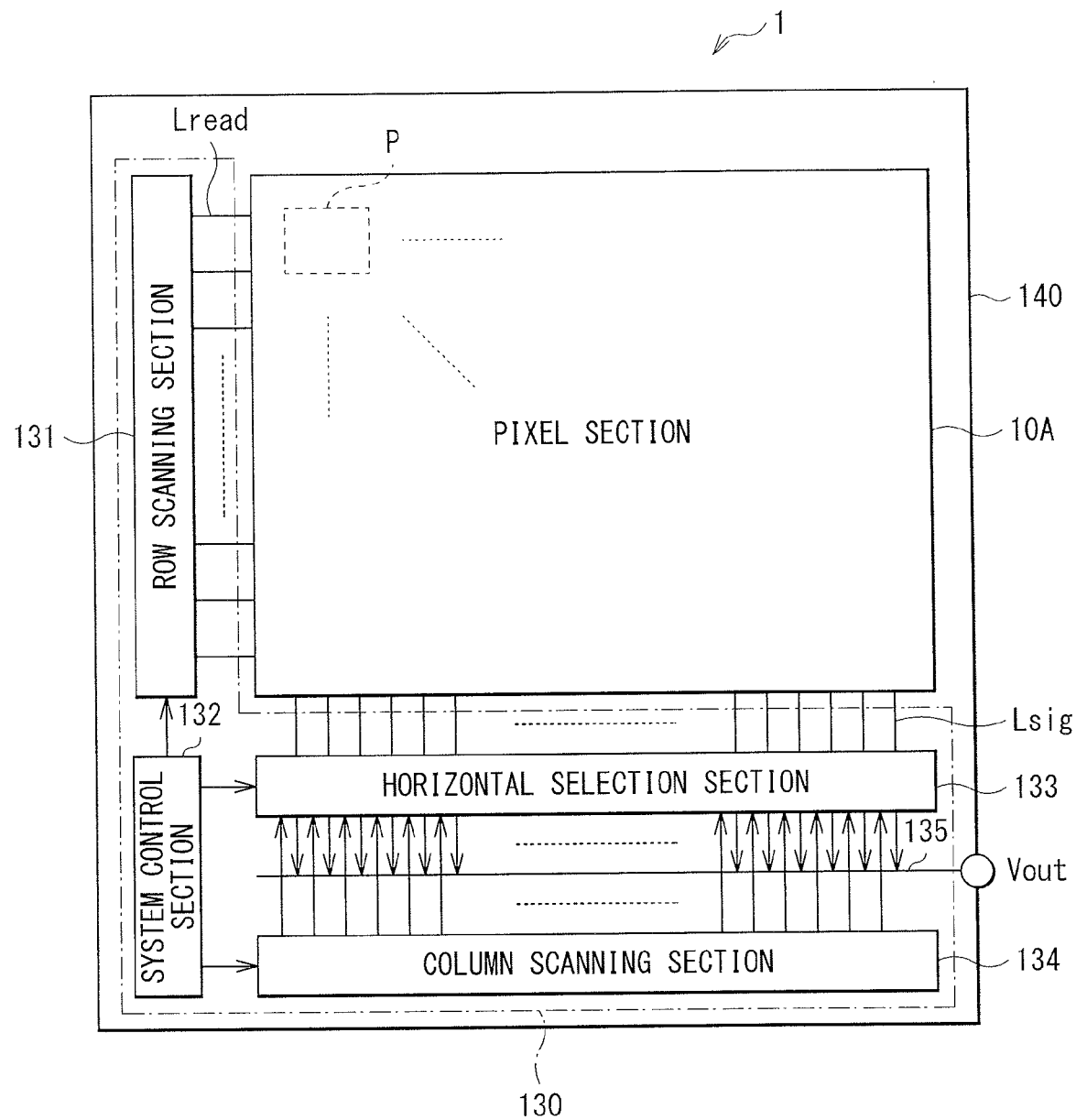
FIG. 25 is a functional block diagram of a solid-state imaging unit according to Application example 1.

FIG. 25 illustrates a general configuration of a solid-state imaging unit (a solid-state imaging unit 1) that uses, as a pixel, the photoelectric conversion device described in the above embodiment, modifications, and the like. The solid-state imaging unit 1 is a CMOS image sensor. The solid-state imaging unit 1 has a pixel section 1a as an imaging area on a substrate 140. Also, the solid-state imaging unit 1 may include, for example, a peripheral circuit section 130 configured of a row scanning section 131, a horizontal selection section 133, a horizontal selection section 134, and a system control section 132 in a peripheral region of this pixel section 1a.

The pixel section 1a may include, for example, a plurality of unit pixels P (corresponding to the photoelectric conversion devices 10) that are arranged two-dimensionally in a matrix. To this unit pixels P, for example, pixel drive lines Lread (specifically, row selection lines and reset control lines) may be wired on a pixel-row basis, and vertical signal lines Lsig are wired on a pixel-column basis. The pixel drive line Lread transmits a drive signal for reading a signal from the pixel. One end of the pixel drive line Lread is connected to an output terminal corresponding to each row in the row scanning section 131.

The row scanning section 131 is configured of a shift register, an address decoder, etc. The row scanning section 131 may be, for example, a pixel drive section that drives the respective pixels P in the pixel section 1*a* on a row-unit basis. Signals outputted from the respective pixels P in the pixel row selectively scanned by the row scanning section 131 are supplied to the horizontal selection section 133 via the respective vertical signal lines Lsig. The horizontal selection section 133 is configured of an amplifier, a horizontal selection switch, etc. that are provided for each vertical signal line Lsig.

The horizontal selection section 134 is configured of a shift register, an address decoder, etc. The horizontal selection section 134 sequentially drives the respective horizontal selection switches in the horizontal selection section 133 while scanning the respective horizontal selection switches in the horizontal selection section 133. Due to this selective scanning by the horizontal selection section 134, signals of the respective pixels transmitted via the respective vertical signal lines Lsig are sequentially outputted to horizontal signal lines 19, and are transmitted to outside of the substrate 140 via the horizontal signal lines 19.

The circuit part configured of the row scanning section 131, the horizontal selection section 133, the horizontal selection section 134, and the horizontal signal lines 19 may be formed directly on the substrate 140, or may be arranged in an external control IC. Alternatively, that circuit part may be formed on another substrate connected with the use of a cable, etc.

The system control section 132 receives a clock, data instructing an operation mode, etc. that are supplied from the outside of the substrate 140. The system control section 132 also outputs data such as internal information of the radiation imaging unit 1. Further, the system control section 132 includes a timing generator that generates various timing signals, and performs drive control of peripheral circuits such as the row scanning section 131, the horizontal selection section 133, and the horizontal selection section 134 based on the various timing signals generated by the timing generator.

Application Example 2

Figure 26:
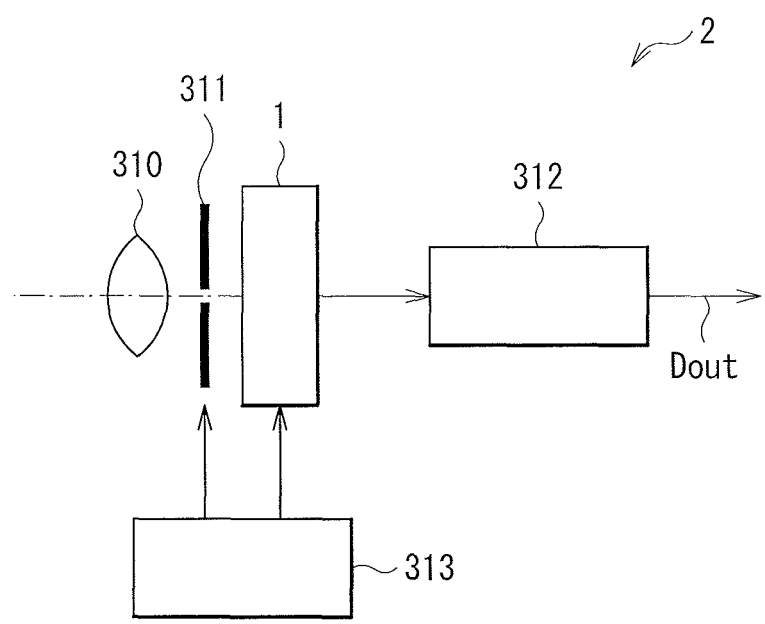
FIG. 26 is a functional block diagram of an electronic apparatus according to Application example 2.

The above-described solid-state imaging unit 1 may be applicable to any type of electronic apparatus having an imaging function, for example, a camera system such as a digital still camera and a video camcorder, a mobile phone having an imaging function, etc. FIG. 26 illustrates a schematic configuration of an electronic apparatus 2 (a camera) as an example thereof. This electronic apparatus 2 may be, for example, a video camcorder that is capable of shooting a still image or a moving image. The electronic apparatus 2 may include the solid-state imaging unit 1, an optical system (an optical lens) 310, a shutter unit 311, a drive section 313 that drives the solid-state imaging unit 1 and the shutter unit 311, and a signal processing section 312.

The optical system 310 guides image light (incident light) from a subject to the pixel section 1*a* in the solid-state imaging unit 1. This optical system 310 may be configured of a plurality of optical lenses. The shutter unit 311 controls periods of light irradiation and light blocking with respect to the solid-state imaging unit 1. The drive section 313 controls a transfer operation of the solid-state imaging unit 1 and a shutter operation of the shutter unit 311. The signal processing section 312 performs various signal processes on a signal outputted from the solid-state imaging unit 1. An image signal Dout after the signal processing is stored in a storage medium such as a memory, or outputted to a monitor, etc.

Hereinabove, description has been provided referring to the embodiment and the modifications thereof. However, content of the present disclosure is not limited to the above-described embodiment and the like, and various modifications may be made. For example, in the above-described embodiment and the like, the photoelectric conversion device has a configuration in which the organic photoelectric conversion section 11G that detects green light, and the inorganic photoelectric conversion sections 11B and 11R that detect blue light and red light, respectively, are laminated. However, the content of the present disclosure is not limited to such a structure. Specifically, red or blue light may be detected in the organic photoelectric conversion section, and green light may be detected in the inorganic photoelectric conversion section. Moreover, the numbers, ratio, etc. of these organic and inorganic photoelectric conversion sections are not limited either. Two or more organic photoelectric conversion sections may be provided, or color signals of a plurality of colors may be obtained only by the organic photoelectric conversion sections. Moreover, the organic photoelectric conversion section and the inorganic photoelectric conversion section are not limited to have a vertically-laminated structure, and may be arranged side by side along the substrate surface.

Moreover, the photoelectric conversion device of the present disclosure does not necessarily include all of the components described in the above embodiment, and may include other layer in reverse.

It is to be noted that the disclosure may have the following configurations.

(1) A method of manufacturing a photoelectric conversion device, the method including:

forming a first electrode on a first surface side of a substrate that has two opposing surfaces;

forming an electrode section on a second surface side of the substrate, the electrode section being used for external connection; and after forming the first electrode and the electrode section, forming an organic photoelectric conversion layer and a second electrode on the first electrode.

(2) The method according to (1), further including forming a lens component including a micro lens, the second electrode, and the organic photoelectric conversion layer, wherein the organic photoelectric conversion layer and the second electrode are formed on the first electrode by attaching the lens component onto the first electrode.

(3) The method according to (2), wherein forming of the lens component includes forming the second electrode on a first substrate with a first adhesive layer in between, the first adhesive layer being allowed to be peeled off, forming the micro lens on the second electrode, attaching a protective substrate onto the micro lens with an adhesive layer in between, after attaching the protective substrate, removing the first adhesive layer and the first substrate, and thereby allowing the second electrode to be exposed, and forming the organic photoelectric conversion layer on the exposed second electrode.

(4) The method according to (2) or (3), wherein, in forming the micro lens, a light blocking film is formed in a peripheral edge region of the micro lens.

(5) The method according to any one of (2) to (4), wherein, before attaching the lens component onto the first electrode, a planarization process is performed on a surface of the organic photoelectric conversion layer and a surface of the first electrode that are opposed to each other.

(6) The method according to any one of (2) to (5), wherein, in attaching the lens component onto the first electrode, beam of an element or an element ion is applied to a surface of the organic photoelectric conversion layer and a surface of the first electrode that are opposed to each other, and then, the organic photoelectric conversion layer is attached to the first electrode.

(7) The method according to any one of (2) to (5), wherein, in attaching the lens component onto the first electrode, an electrically-conductive adhesive is used.

(8) The method according to (1), further including
forming a lens component including a micro lens and the second electrode, wherein,
after forming the organic photoelectric conversion layer on the first electrode, the second electrode is formed on the organic photoelectric conversion layer by attaching the lens component onto the organic photoelectric conversion layer.

(9) A photoelectric conversion device including:
an organic photoelectric conversion section provided on a first surface side of a substrate that includes two opposing surfaces and including a first electrode, an organic photoelectric conversion layer, and a second electrode in order from the substrate; and
an electrode section provided on a second surface side of the substrate and used for external connection.

(10) The photoelectric conversion device according to (9), further including a micro lens on the organic photoelectric conversion section.

(11) The photoelectric conversion device according to (10), further including a protective substrate on the micro lens, wherein a region between the micro lens and the protective substrate is filled with an adhesive layer.

(12) The photoelectric conversion device according to (10) or (11), wherein a light blocking film is formed in a peripheral edge region of the micro lens.

(13) The photoelectric conversion device according to any one of (9) to (12), wherein a surface of the first electrode and a surface of the organic photoelectric conversion layer that are opposed to each other are both planarized surfaces.

(14) The photoelectric conversion device according to any one of (9) to (13), further including an electrically-conductive adhesive layer between the first electrode and the organic photoelectric conversion layer.

(15) The photoelectric conversion device according to any one of (9) to (14), wherein the electrode section is provided on a second surface side of the substrate with a multi-layered wiring layer in between.

(16) The photoelectric conversion device according to any one of (9) to (15), wherein the substrate is configured of a semiconductor and includes one or a plurality of inorganic photoelectric conversion sections that are laminated therein.

(17) The photoelectric conversion device according to (16), wherein
the organic photoelectric conversion section performs photoelectric conversion on green light, and
the substrate includes an inorganic photoelectric conversion section performing photoelectric conversion on blue light and an inorganic photoelectric conversion section performing photoelectric conversion on red light that are laminated therein.

(18) A solid-state imaging unit including a photoelectric conversion device as a pixel,
the photoelectric conversion device including
an organic photoelectric conversion section provided on a first surface side of a substrate that has two opposing surfaces and including a first electrode, an organic photoelectric conversion layer, and a second electrode in order from the substrate, and
an electrode section provided on a second surface side of the substrate and used for external connection.

(19) An electronic apparatus including a solid-state imaging unit including a photoelectric conversion device as a pixel,
the photoelectric conversion device including
an organic photoelectric conversion section provided on a first surface side of a substrate that has two opposing surfaces and including a first electrode, an organic photoelectric conversion layer, and a second electrode in order from the substrate, and
an electrode section provided on a second surface side of the substrate and used for external connection.

This application claims priority on the basis of Japanese Patent Application JP 2012-012654 filed Jan. 25, 2012 in Japan Patent Office, the entire contents of each which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a photoelectric conversion device, the method comprising:
forming a first electrode on a first surface side of a substrate that has two opposing surfaces;
forming an electrode section on a second surface side of the substrate, the electrode section being used for external connection;
after forming the first electrode and the electrode section, forming an organic photoelectric conversion layer and a second electrode on the first electrodes; and
forming a lens component including a micro lens, the second electrode, and the organic photoelectric conversion layer, wherein the organic photoelectric conversion layer and the second electrode are formed on the first electrode by attaching the lens component onto the first electrode, and
wherein forming of the lens component includes
forming the second electrode on a first substrate with a first adhesive layer in between, the first adhesive layer being allowed to be peeled off,
forming the micro lens on the second electrode,
attaching a protective substrate onto the micro lens with an adhesive layer in between,
after attaching the protective substrate, removing the first adhesive layer and the first substrate, and thereby allowing the second electrode to be exposed, and
forming the organic photoelectric conversion layer on the exposed second electrode.

2. The method according to claim 1, wherein, in forming the micro lens, a light blocking film is formed in a peripheral edge region of the micro lens.

3. The method according to claim 1, wherein, before attaching the lens component onto the first electrode, a planarization process is performed on a surface of the organic photoelectric conversion layer and a surface of the first electrode that are opposed to each other.

4. The method according to claim 1, wherein, in attaching the lens component onto the first electrode, a beam of an element or an element ion is applied to a surface of the organic photoelectric conversion layer and a surface of the first electrode that are opposed to each other, and then, the organic photoelectric conversion layer is attached to the first electrode.

5. The method according to claim 1, wherein, in attaching the lens component onto the first electrode, an electrically-conductive adhesive is used.

6. A method of manufacturing a photoelectric conversion device, the method comprising:
forming a first electrode on a first surface side of a substrate that has two opposing surfaces;
forming an electrode section on a second surface side of the substrate, the electrode section being used for external connection;
after forming the first electrode and the electrode section, forming an organic photoelectric conversion layer and a second electrode on the first electrode; and
forming a lens component including a micro lens, the second electrode, and the organic photoelectric conversion layer,
wherein the organic photoelectric conversion layer and the second electrode are formed on the first electrode by attaching the lens component onto the first electrode, wherein, in attaching the lens component onto the first electrode, a beam of an element or an element ion is applied to a surface of the organic photoelectric conversion layer and a surface of the first electrode that are opposed to each other, and then, the organic photoelectric conversion layer is attached to the first electrode.

7. The method according to claim 6, wherein, in forming the micro lens, a light blocking film is formed in a peripheral edge region of the micro lens.

8. The method according to claim 6, wherein, before attaching the lens component onto the first electrode, a planarization process is performed on a surface of the organic photoelectric conversion layer and a surface of the first electrode that are opposed to each other.

9. A method of manufacturing a photoelectric conversion device, the method comprising:
forming a first electrode on a first surface side of a substrate that has two opposing surfaces;
forming an electrode section on a second surface side of the substrate, the electrode section being used for external connection;
after forming the first electrode and the electrode section, forming an organic photoelectric conversion layer and a second electrode on the first electrode; and
forming a lens component including a micro lens, the second electrode, and the organic photoelectric conversion layer,
wherein the organic photoelectric conversion layer and the second electrode are formed on the first electrode by attaching the lens component onto the first electrode wherein, in attaching the lens component onto the first electrode, an electrically-conductive adhesive is used.

10. The method according to claim 9, wherein, in forming the micro lens, a light blocking film is formed in a peripheral edge region of the micro lens.

11. The method according to claim 9, wherein, before attaching the lens component onto the first electrode, a planarization process is performed on a surface of the organic photoelectric conversion layer and a surface of the first electrode that are opposed to each other.

* * * * *